US011072767B2

(12) United States Patent
Takahashi et al.

(10) Patent No.: US 11,072,767 B2
(45) Date of Patent: Jul. 27, 2021

(54) TREATMENT LIQUID, KIT, AND METHOD FOR WASHING SUBSTRATE

(71) Applicant: FUJIFILM Corporation, Tokyo (JP)

(72) Inventors: Tomonori Takahashi, Haibara-gun (JP); Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/774,220

(22) Filed: Jan. 28, 2020

(65) Prior Publication Data

US 2020/0165547 A1   May 28, 2020

Related U.S. Application Data

(63) Continuation of application No. PCT/JP2018/030101, filed on Aug. 10, 2018.

(30) Foreign Application Priority Data

Aug. 31, 2017 (JP) .............................. JP2017-167730
Mar. 23, 2018 (JP) .............................. JP2018-055933

(51) Int. Cl.
*C11D 7/32* (2006.01)
*C11D 7/50* (2006.01)
*C11D 11/00* (2006.01)
*H01L 21/02* (2006.01)

(52) U.S. Cl.
CPC .......... *C11D 7/3281* (2013.01); *C11D 7/5013* (2013.01); *C11D 7/5022* (2013.01); *C11D 11/0047* (2013.01); *H01L 21/02052* (2013.01)

(58) Field of Classification Search
CPC .................................................. C11D 11/0047
USPC ......................................................... 510/175
See application file for complete search history.

(56) References Cited

U.S. PATENT DOCUMENTS

| | | | | |
|---|---|---|---|---|
| 8,361,237 B2* | 1/2013 | Wu | ....................... | C11D 7/5004 134/1.2 |
| 9,562,211 B2 | 2/2017 | Takahashi et al. | | |
| 2009/0215658 A1* | 8/2009 | Minsek | ............... | H01L 21/3212 510/175 |
| 2009/0301996 A1* | 12/2009 | Visintin | ............ | H01L 21/02063 216/13 |
| 2010/0051066 A1* | 3/2010 | Kuwabara | ........... | C11D 11/0047 134/41 |
| 2010/0056410 A1* | 3/2010 | Visintin | .............. | C11D 11/0047 510/176 |
| 2010/0163788 A1* | 7/2010 | Visintin | ................... | C11D 1/62 252/79.3 |

(Continued)

FOREIGN PATENT DOCUMENTS

| | | |
|---|---|---|
| WO | 2016/076033 A1 | 5/2016 |
| WO | 2017/099211 A1 | 6/2017 |

OTHER PUBLICATIONS

International Search Report dated Nov. 6, 2018, issued by the International Searching Authority in application No. PCT/JP2018/030101.

(Continued)

*Primary Examiner* — Gregory E Webb
(74) *Attorney, Agent, or Firm* — Sughrue Mion, PLLC

(57) ABSTRACT

A treatment liquid for a semiconductor device is a treatment liquid including water, an organic solvent, and two or more nitrogen-containing aromatic heterocyclic compounds.

59 Claims, 1 Drawing Sheet

(56) References Cited

U.S. PATENT DOCUMENTS

| | | | |
|---|---|---|---|
| 2010/0197136 A1* | 8/2010 | Shimada | C11D 3/0073 |
| | | | 438/653 |
| 2013/0296214 A1* | 11/2013 | Barnes | H01L 21/02063 |
| | | | 510/176 |
| 2015/0027978 A1* | 1/2015 | Barnes | C23F 1/02 |
| | | | 216/13 |
| 2016/0083675 A1* | 3/2016 | Morita | C11D 7/3209 |
| | | | 438/687 |
| 2016/0130500 A1* | 5/2016 | Chen | C09K 13/02 |
| | | | 216/13 |
| 2017/0110363 A1* | 4/2017 | Aoyama | C11D 3/364 |
| 2017/0200601 A1* | 7/2017 | Song | H01L 21/02063 |
| 2017/0240850 A1 | 8/2017 | Oie et al. | |
| 2017/0253840 A1* | 9/2017 | Goto | C11D 7/08 |

OTHER PUBLICATIONS

Written Opinion dated Nov. 6, 2018, issued by the International Searching Authority in application No. PCT/JP2018/030101.
International Preliminary Report on Patentability dated Mar. 3, 2020, issued by the International Bureau in application No. PCT/JP2018/030101.
Office Action dated Mar. 23, 2021, issued by Japanese Patent Office in Japanese Application No. 2019-539155.
Office Action dated Mar. 16, 2021, issued by the Korean Intellectual Property Office in Korean Application No. 10-2020-7003416.

* cited by examiner

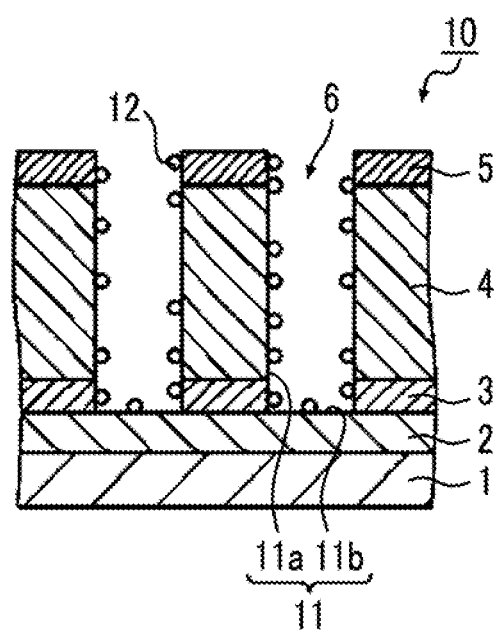

TREATMENT LIQUID, KIT, AND METHOD FOR WASHING SUBSTRATE

CROSS-REFERENCE TO RELATED APPLICATIONS

This application is a Continuation of PCT International Application No. PCT/JP2018/30101, filed on Aug. 10, 2018, which claims priority under 35 U.S.C. § 119(a) to Japanese Patent Application No. 2017-167730, filed on Aug. 31, 2017 and Japanese Patent Application No. 2018-055933, filed on Mar. 23, 2018. Each of the above application(s) is hereby expressly incorporated by reference, in its entirety, into the present application.

BACKGROUND OF THE INVENTION

1. Field of the Invention

The present invention relates to a treatment liquid, a kit, and a method for washing a substrate.

2. Description of the Related Art

A semiconductor device such as a charge-coupled device (CCD) and a memory is manufactured by forming fine electronic circuit patterns on a substrate using a photolithographic technique. For example, the semiconductor device is manufactured by arranging a laminate having a metal layer that serves as a wiring material, an etching stop film, and an interlayer insulating film on a substrate, forming a resist film on the laminate, and carrying out a photolithography step and a dry etching step (for example, a plasma etching treatment).

Specifically, in the photolithography step, the metal layer and/or the interlayer insulating film on the substrate is etched by a dry etching treatment using the obtained resist film as a mask.

At this time, residues derived from the metal layer and/or the interlayer insulating film, and the like adhere to the substrate, the metal layer, and/or the interlayer insulating film in some cases. In order to remove the adhering residues, washing using a treatment liquid is typically performed in many cases.

Furthermore, the resist film used as a mask during the etching is then removed from the laminate using a dry method (dry ashing) by ashing, a wet method, or the like. In some cases, the residues derived from the resist film or the like adhere to the laminate from which the resist has been removed using the dry ashing method. In order to remove the adhering residues, washing using a treatment liquid is typically performed in many cases.

On the other hand, examples of a wet method for removing the resist film include an aspect in which the resist film is removed using a treatment liquid.

As described above, the treatment liquid is used for the removal of residues (etching residues and ashing residues) and/or a resist film, or the like in a semiconductor device manufacturing step.

For example, U.S. Pat. No. 9,562,211B discloses a washing composition including 5-methyl-1H-benzotriazole (5MBTA) as an anticorrosive agent.

SUMMARY OF THE INVENTION

The present inventors have conducted studies on the washing composition (treatment liquid) described in U.S. Pat. No. 9,562,211B, and have thus found that the treatment liquid may corrode a metal layer (for example, a metal layer including Co, a metal layer including W, and a metal layer including Cu) that serves as a wiring material, a plug material, and the like in some cases. That is, the present inventors have clarified that the treatment liquid has room for further improving anticorrosion properties for an object to be treated.

Moreover, the treatment liquid has been continuously required to have improved residue removing properties.

In addition, a further reduction in particulate defects (foreign matters) adhering to a substrate has been required, along with miniaturization of a wiring in recent years. That is, the treatment liquid has been required to have defect suppressing properties.

Therefore, an object of the present invention is to provide a treatment liquid for a semiconductor device, which has excellent anticorrosion properties for an object to be treated, residue removing properties, and defect suppressing properties.

In addition, according to the present invention, it is possible to provide a kit and a method for washing a substrate with the treatment liquid.

The present inventors have conducted extensive studies in order to accomplish the objects, and as a result, they have found that the objects can be accomplished by incorporating two or more nitrogen-containing aromatic heterocyclic compounds (preferably incorporating a nitrogen-containing aromatic heterocyclic compound (A) and a nitrogen-containing aromatic heterocyclic compound (B)) into the treatment liquid, thereby completing the present invention.

That is, the present inventors have discovered that the object can be accomplished by the following configurations.

(1) A treatment liquid for a semiconductor device, comprising:
water;
an organic solvent; and
two or more nitrogen-containing aromatic heterocyclic compounds.

(2) The treatment liquid as described in (1),
in which a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) which will be described later or a compound represented by General Formula (IV) which will be described later, and
the nitrogen-containing aromatic heterocyclic compound (B) is at least one selected from the group consisting of a compound represented by General Formula (II), a compound represented by General Formula (III) which will be described later, and a compound represented by General Formula (V) which will be described later.

(3) The treatment liquid as described in (2),
in which a mass content ratio of the nitrogen-containing aromatic heterocyclic compound (A) to the nitrogen-containing aromatic heterocyclic compound (B) is 2 to 30,000.

(4) The treatment liquid as described in (2) or (3),
in which the nitrogen-containing aromatic heterocyclic compound (B) includes two compounds selected from the group consisting of the compound represented by General Formula (II), the compound represented by General Formula (III), and the compound represented by General Formula (V),
a mass ratio of the two compounds is 1 to 10,000.

(5) The treatment liquid as described in any one of (2) to (4),
in which a content of the nitrogen-containing aromatic heterocyclic compound (B) is 0.01 to 10,000 ppm by mass with respect to a total mass of the treatment liquid.

(6) The treatment liquid as described in any one of (1) to (5), further comprising a cobalt ion.

(7) The treatment liquid as described in (6),
in which the cobalt ion is a cobalt ion derived from at least one cobalt ion source selected from the group consisting of cobalt fluoride, cobalt chloride, cobalt hydroxide, cobalt oxide, and cobalt sulfate.

(8) The treatment liquid as described in (6) or (7),
in which a mass content ratio of the nitrogen-containing aromatic heterocyclic compound (B) to the cobalt ion is $1.0 \times 10^2$ to $1.0 \times 10^6$.

(9) The treatment liquid as described in any one of (1) to (5), further comprising one or more fluorine-containing compounds selected from the group consisting of hydrofluoric acid, ammonium fluoride, tetramethylammonium fluoride, and tetrabutylammonium fluoride.

(10) The treatment liquid as described in (9), further comprising a cobalt ion.

(11) The treatment liquid as described in (10),
in which the cobalt ion is a cobalt ion derived from at least one cobalt ion source selected from the group consisting of cobalt fluoride, cobalt chloride, cobalt hydroxide, cobalt oxide, and cobalt sulfate.

(12) The treatment liquid as described in (10) or (11),
in which a mass content ratio of the fluorine-containing compound to the cobalt ion is $1.0 \times 10^5$ to $1.0 \times 10^8$.

(13) The treatment liquid as described in any one of (1) to (5), and (9), further comprising a basic compound.

(14) The treatment liquid as described in (13), in which the basic compound includes a nitrogen-containing alicyclic compound.

(15) The treatment liquid as described in (13) or (14), in which the basic compound includes a secondary amine.

(16) The treatment liquid as described in (15),
in which a content of the secondary amine is 300 ppb by mass to 3,000 ppm by mass with respect to a total mass of the treatment liquid.

(17) The treatment liquid as described in (15) or (16),
in which a ratio of the mass of the nitrogen-containing aromatic heterocyclic compound (B) to the mass of the secondary amine is 1 to 10,000.

(18) The treatment liquid as described in any one of (13) to (17), further comprising a cobalt ion.

(19) The treatment liquid as described in (18),
in which the cobalt ion is a cobalt ion derived from at least one cobalt ion source selected from the group consisting of cobalt fluoride, cobalt chloride, cobalt hydroxide, cobalt oxide, and cobalt sulfate.

(20) The treatment liquid as described in (18) or (19),
in which a mass content ratio of the basic compound to the cobalt ion is $1.0 \times 10^5$ to $1.0 \times 10^9$.

(21) The treatment liquid as described in any one of (1) to (20),
in which the organic solvent includes at least one selected from the group consisting of a glycol-based solvent, a glycol ether-based solvent, an amide-based solvent, an alcohol-based solvent, and a sulfoxide-based solvent.

(22) The treatment liquid as described in any one of (1) to (21),
in which the treatment liquid is used as a washing liquid for removing etching residues, a solution for removing a resist film used for pattern formation, a washing liquid for removing residues from a substrate after chemical mechanical polishing, or an etching liquid.

(23) The treatment liquid as described in any one of (6) to (8), (10) to (12), and (18) to (20),
in which a content of the water is 10% to 97% by mass with respect to a total mass of the treatment liquid,
a content of the organic solvent is 1% to 85% by mass with respect to a total mass of the treatment liquid,
a content of the nitrogen-containing aromatic heterocyclic compound is 0.05% to 5% by mass with respect to a total mass of the treatment liquid, and
a content of the cobalt ion is 0.001 to 10 ppb by mass with respect to a total mass of the treatment liquid.

(24) A kit comprising the treatment liquid as described in any one of (1) to (23) and a solvent selected from the group consisting of water, isopropanolamine, and a dilute solution including ammonia.

(25) A method for washing a substrate, comprising:
washing a substrate with the treatment liquid as described in any one of (1) to (23),
in which the substrate has a metal layer including any one or more selected from the group consisting of Co, W, and Cu.

(26) The method for washing a substrate as described in (25),
in which the substrate further has a metal hard mask including at least one component selected from the group consisting of Cu, Co, a Co alloy, W, a W alloy, Ru, an Ru alloy, Ta, a Ta alloy, AlOx, AlN, AlOxNy, TiAl, Ti, TiN, TiOx, ZrOx, HfOx, TaOx, LaOx, and YSiOx, and
x and y are a number satisfying x=1 to 3 and a number satisfying y=1 or 2, respectively.

According to the present invention, it is possible to provide a treatment liquid for a semiconductor device, which has excellent anticorrosion properties for an object to be treated, residue removing properties, and defect suppressing properties.

In addition, according to the present invention, it is possible to provide a kit and a method for washing a substrate with the treatment liquid.

BRIEF DESCRIPTION OF THE DRAWINGS

FIG. 1 is a schematic cross-sectional view showing an example of a laminate (a substrate comprising a metal layer and an interlayer insulating film) which can be applied to a method for washing a substrate according to an embodiment of the present invention.

DESCRIPTION OF THE PREFERRED EMBODIMENTS

Hereinbelow, the present invention will be described in detail.

Description of configuration requirements described below may be made on the basis of representative embodiments of the present invention in some cases, but the present invention is not limited to such embodiments.

Furthermore, in the present invention, the numerical value ranges shown using "to" mean ranges including the numerical values indicated before and after "to" as the lower limit value and the upper limit value, respectively.

Moreover, in the present specification, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", and "ppt" means "parts-per-trillion ($10^{-12}$)".

Furthermore, in the present invention, 1 Å (angstrom) corresponds to 0.1 nm.

In addition, in citations for a group (atomic group) in the present invention, in a case where the group is denoted without specifying whether it is substituted or unsubstituted, the group includes both a group having no substituent and a group having a substituent within a range not impairing the effects of the present invention. For example, a "hydrocarbon group" includes not only a hydrocarbon group having no substituent (unsubstituted hydrocarbon group) but also a hydrocarbon group having a substituent (substituted hydrocarbon group). This also applies to the respective compounds.

In addition, "radiation" in the present invention means, for example, a bright line spectrum of a mercury lamp, far ultraviolet rays typified by excimer laser, extreme ultraviolet rays (EUV light), X-rays, electron beams, or the like. Further, the term "light" in the present invention means actinic rays or radiation. Unless otherwise indicated, the term "exposure" in the present invention includes not only exposure to a bright line spectrum of a mercury lamp, far ultraviolet rays typified by excimer laser, X-rays, EUV light, or the like but also writing with particle beams such as electron beams and ion beams.

[Treatment Liquid]

The treatment liquid of the embodiment of the present invention may include two or more nitrogen-containing aromatic heterocyclic compounds. The nitrogen-containing aromatic heterocyclic compound coordinates onto the surface of a metal layer that serves a wiring material, a plug material, or the like via a nitrogen atom, thereby forming a dense organic film on the surface of the metal layer. Here, it is presumed that in a case where two or more nitrogen-containing aromatic heterocyclic compounds are present, the organic film formed on the surface of the metal layer becomes denser. As a result, the metal layer is protected with the organic film, and is thus less likely to be corroded with the treatment liquid.

In particular, in a case where the treatment liquid includes a nitrogen-containing aromatic heterocyclic compound (A) which will be described later and a nitrogen-containing aromatic heterocyclic compound (B) which will be described later as the nitrogen-containing aromatic heterocyclic compound, the organic film formed on the surface of the metal layer becomes more hydrophobic. As a result, the anticorrosion properties for the metal layer of the treatment liquid are more excellent. That is, it is considered that the elution of a metal from the metal layer is suppressed, and as a result, the anticorrosion properties for the metal layer are more excellent.

Furthermore, it is also confirmed that the residue removing properties and the defect removing properties are also excellent by incorporating water and an organic solvent into the treatment liquid.

The treatment liquid of the embodiment of the present invention has excellent anticorrosion properties for an object to be treated, residue removing properties, and defect suppressing properties by synergistically enhancing the action effects.

[Water]

The treatment liquid of the embodiment of the present invention includes water.

The content of the water is not particularly limited, but is, for example, 1% to 97% by mass with respect to a total mass of the treatment liquid, and preferably 10% to 97% by mass with respect to a total mass of the treatment liquid.

Ultrapure water used for manufacturing a semiconductor device is preferable as the water.

In particular, water having reduced inorganic anions, metal ions, and the like is preferable as the water, and among these, water having a reduced concentration of ions derived from metal atoms of Fe, Co, Na, K, Ca, Cu, Mg, Mn, Li, Al, Cr, Ni, and Zn is more preferable, and in a case of a use in the preparation of the treatment liquid of the embodiment of the present invention, water having a metal content adjusted to a ppt order or less (a metal content of less than 0.001 ppt by mass in one aspect) is still more preferable. As the adjustment method, purification using a filtering film or an ion exchange membrane, or purification by distillation is preferable. Examples of the adjustment method include the method described in paragraphs <0074> to <0084> of JP2011-110515A, and the method described in JP2007-254168A.

Moreover, the water used in the embodiments of the present invention is preferably water obtained as above. Further, from the viewpoint that desired effects of the present invention are remarkably obtained, the above-mentioned water is more preferably used not only for the treatment liquid of the embodiment of the present invention but also for washing a storage container. In addition, the above-mentioned water is also preferably used in a step of producing the treatment liquid of the embodiment of the present invention, measurement of components of the treatment liquid of the embodiment of the present invention, measurement for evaluation of the treatment liquid of the embodiment of the present invention, and the like.

[Organic Solvent]

The treatment liquid of the embodiment of the present invention includes an organic solvent. The treatment liquid of the embodiment of the present invention has excellent anticorrosion properties for a metal layer and excellent defect suppressing properties by incorporating the organic solvent into the treatment liquid.

The organic solvent is not particularly limited, but is preferably a hydrophilic organic solvent. Further, the hydrophilic organic solvent in the present specification is intended to mean an organic solvent which can dissolve 0.1 g or more in 100 g of water under the condition of 25° C., and as the hydrophilic organic solvent, an organic solvent which can be uniformly mixed with water at any ratio is preferable.

Specifically, at least one selected from the group consisting of a glycol-based solvent, a glycol ether-based solvent, an amide-based solvent, an alcohol-based solvent, and a sulfoxide-based solvent is preferable as the hydrophilic organic solvent.

The glycol-based solvent is not particularly limited, but examples thereof include ethylene glycol, propylene glycol, diethylene glycol, dipropylene glycol, triethylene glycol, and tetraethylene glycol.

The glycol ether-based solvent is not particularly limited, but examples thereof include glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol mono-n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

The amide-based solvent is not particularly limited, but examples thereof include N,N-dimethyl formamide, 1-methyl-2-pyrrolidone, 2-pyrrolidinone, 1,3-dimethyl-2-imidazolidinone, formamide, N-methyl formamide, acetamide, N-methylacetamide, N,N-dimethylacetamide, N-methylpropanamide, and hexamethylphosphoric triamide.

The alcohol-based solvent is not particularly limited, but examples thereof include alkanediol, alkoxyalcohol, saturated aliphatic monohydric alcohol, and unsaturated non-aromatic monohydric alcohol.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of the alkoxyalcohol include 3-methoxy-3-methyl-1-butanol, 3-methoxy-1-butanol, 1-methoxy-2-butanol, and glycol monoether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the sulfoxide-based solvent include dimethyl sulfoxide.

Among the hydrophilic organic solvents, the glycol ether-based solvent is preferable from the viewpoint that the anticorrosion properties for a metal layer are more excellent.

The organic solvent may be used singly or in combination of two or more kinds thereof.

The content of the organic solvent (the total content thereof in a case where a plurality of kinds of the organic solvents are present) in the treatment liquid of the embodiment of the present invention is, for example, 0.05% to 98% by mass with respect to a total mass of the treatment liquid, and preferably 1% to 85% by mass with respect to a total mass of the treatment liquid.

[Nitrogen-Containing Aromatic Heterocyclic Compound]

In the treatment liquid of the embodiment of the present invention, the nitrogen-containing aromatic heterocyclic compound prevents corrosion of a metal layer due to overetching and the like by coordinating to the surface of the metal layer that serves a wiring of a semiconductor device to form a dense film. That is, the nitrogen-containing aromatic heterocyclic compound functions as an anticorrosive agent.

The treatment liquid of the embodiment of the present invention includes at least two or more nitrogen-containing aromatic heterocyclic compounds. In a case where the treatment liquid includes at least two or more nitrogen-containing aromatic heterocyclic compounds, the film formed on the surface of the metal layer becomes denser, and thus, the anticorrosion properties for the metal layer are more excellent, as compared with a case where the treatment liquid includes only one nitrogen-containing aromatic heterocyclic compound.

The treatment liquid of the embodiment of the present invention preferably includes, among those, the nitrogen-containing aromatic heterocyclic compound (A) and the nitrogen-containing aromatic heterocyclic compound (B) as the nitrogen-containing aromatic heterocyclic compound. In a case where the treatment liquid includes the nitrogen-containing aromatic heterocyclic compound (A) and the nitrogen-containing aromatic heterocyclic compound (B) as the nitrogen-containing aromatic heterocyclic compound, the anticorrosion properties for a metal layer is more excellent.

The nitrogen-containing aromatic heterocyclic compound (A) is a compound represented by General Formula (I) or a compound represented by General Formula (IV), and the nitrogen-containing aromatic heterocyclic compound (B) is at least one selected from the group consisting of a compound represented by General Formula (II), a compound represented by General Formula (III), and a compound represented by General Formula (V).

Hereinafter, the compounds represented by General Formulae (I) to (V) will be described.

<Compound Represented by General Formula (I)>

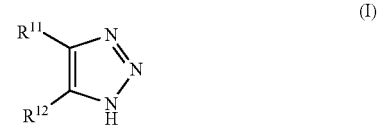

In General Formula (I), $R^{11}$ and $R^{12}$ each independently represent a hydrogen atom, or a substituted or unsubstituted hydrocarbon group. Further, $R^{11}$ and $R^{12}$ may be bonded to each other to form a ring.

In General Formula (I), examples of the hydrocarbon group represented by each of $R^{11}$ and $R^{12}$ include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 18 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Furthermore, the hydrocarbon group represented by each of $R^{11}$ and $R^{12}$ may have a substituent. Examples of the substituent include an alkyl group (preferably having 1 to 12 carbon atoms, more preferably having 1 to 6 carbon atoms, and still more preferably having 1 to 3 carbon atoms), an aryl group (preferably having carbon atoms 6 to 18, more preferably having 6 to 14 carbon atoms, and still more preferably having 6 to 10 carbon atoms), a hydroxyl group, a carboxy group, and —N($R_a$)($R_b$). $R_a$ and $R_b$ each independently represent a hydrogen atom or an organic group. As the organic group, an alkyl group (for example, preferably having 1 to 12 carbon atoms, having 1 to 6 carbon atoms, and more preferably having 1 to 4 carbon atoms), or a hydroxyalkyl group (for example, having 1 to 12 carbon atoms, preferably having 1 to 6 carbon atoms, and more preferably having 1 to 4 carbon atoms) is preferable.

Moreover, $R^{11}$ and $R^{12}$ may be bonded to each other to form a ring. The ring formed by mutual bonding of $R^{11}$ and $R^{12}$ is not particularly limited, but is preferably an aromatic ring (which may be monocyclic or polycyclic), and more preferably a benzene ring. Further, the ring formed by mutual bonding of $R^{11}$ and $R^{12}$ may have a substituent. The substituent is not particularly limited, but examples thereof include those exemplified as the substituent of the hydrocarbon group represented by each of $R^{11}$ and $R^{12}$.

Moreover, in the present specification, the compound represented by General Formula (I) includes a compound represented by General Formula (IA) which is a tautomer of the compound.

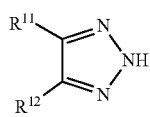
(IA)

In General Formula (IA), $R^{11}$ and $R^{12}$ have the same definitions as RH and $R^{12}$, respectively, in General Formula (I), and suitable aspects thereof are also the same.

<Compound Represented by General Formula (II)>

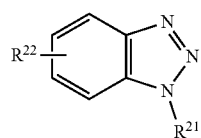
(II)

In General Formula (II), $R^{11}$ and $R^{22}$ each independently represent a hydrogen atom, a hydroxyl group, or a substituted or unsubstituted hydrocarbon group.

It should be noted that in a case where $R^{21}$ is the hydrogen atom, $R^{22}$ represents a substituted or unsubstituted hydrocarbon group. Incidentally, in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups.

In General Formula (II), the substituted or unsubstituted hydrocarbon group represented by each of $R^{21}$ and $R^{22}$ has the same definition of the substituted or unsubstituted hydrocarbon group represented by each of RH and $R^{12}$.

Among those, an alkyl group (preferably having 1 to 12 carbon atoms, more preferably having 1 to 6 carbon atoms, and still more preferably having 1 to 3 carbon atoms), or an aryl group (preferably having carbon atoms 6 to 18, more preferably having 6 to 14 carbon atoms, and still more preferably having 6 to 10 carbon atoms) is preferable as the hydrocarbon group represented by $R^{21}$. Further, the hydrocarbon group represented by $R^{21}$ may have a substituent. Examples of the substituent include those exemplified as the substituent of the hydrocarbon group represented by each of $R^{11}$ and $R^{12}$.

Among those, an alkyl group (preferably having 1 to 12 carbon atoms, more preferably having 1 to 6 carbon atoms, and still more preferably having 1 to 3 carbon atoms) is preferable as the hydrocarbon group represented by $R^{22}$. Further, the hydrocarbon group represented by $R^{22}$ may have a substituent. Examples of the substituent include those exemplified as the substituent of the hydrocarbon group represented by each of $R^{11}$ and $R^{12}$.

Moreover, in General Formula (II), in a case where $R^{21}$ is the hydrogen atom, $R^{22}$ represents a substituted or unsubstituted hydrocarbon group. That is, there is no case where $R^{21}$ and $R^{22}$ are both hydrogen atoms.

Furthermore, in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups. In addition, here, from the viewpoint that the anticorrosion properties, the residue removing properties, and the defect suppressing properties are all more excellent, the number of carbon atoms of $R^{22}$ is preferably larger than the number of carbon atoms in the substituent.

<Compound Represented by General Formula (III)>

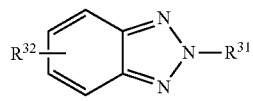
(III)

In General Formula (III), $R^{31}$ and $R^{32}$ each independently represent a hydrogen atom, or a substituted or unsubstituted hydrocarbon group. It should be noted that in a case where $R^{31}$ is the hydrogen atom, $R^{32}$ represents a substituted or unsubstituted hydrocarbon group. Incidentally, in a case where $R^{31}$ is the hydrogen atom, $R^{32}$ represents the substituted or unsubstituted hydrocarbon group, RH and $R^{12}$ in General Formula (I) are bonded to each other to form a benzene ring, and the benzene ring has a substituent, $R^{32}$ and the substituent represent different groups.

In General Formula (III), $R^{31}$ and $R^{32}$ have the same definitions of $R^{21}$ and $R^{22}$, respectively, in General Formula (II), and suitable aspects thereof are also the same.

It should be noted that in a case where $R^{31}$ is the hydrogen atom, $R^{32}$ represents the substituted or unsubstituted hydrocarbon group. Incidentally, in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups. In addition, here, from the viewpoint that the anticorrosion properties, the residue removing properties, and the defect suppressing properties are all more excellent, the number of carbon atoms of $R^{32}$ is preferably larger than the number of carbon atoms in the substituent.

<Compound Represented by General Formula (IV)>

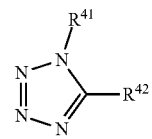
(IV)

In General Formula (IV), $R^{41}$ represents a hydrogen atom. $R^{42}$ represents a hydrogen atom, a hydroxyl group, a mercapto group, or an amino group.

<Compound Represented by General Formula (V)>

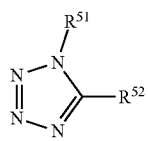
(V)

In General Formula (V), $R^{51}$ and $R^{52}$ each independently represent a hydrogen atom, or a substituted or unsubstituted hydrocarbon group. It should be noted that at least one of $R^{51}$ or $R^{52}$ represents a substituted or unsubstituted hydrocarbon group.

The substituted or unsubstituted hydrocarbon group represented by each of $R^{51}$ and $R^{52}$ has the same definition of the substituted or unsubstituted hydrocarbon group represented by each of $R^{11}$ and $R^{12}$.

Among those, an aryl group (preferably having carbon atoms 6 to 18, more preferably having 6 to 14 carbon atoms, and still more preferably having 6 to 10 carbon atoms) which may be substituted with an alkyl group (preferably having 1 to 12 carbon atoms, more preferably having 1 to 6 carbon atoms, and still more preferably having 1 to 3 carbon atoms) is preferable as the hydrocarbon group represented by each of $R^{51}$ and $R^{52}$.

From the viewpoint that the residue removing properties and the defect suppressing properties are more excellent, as the nitrogen-containing aromatic heterocyclic compound (A), a nitrogen-containing aromatic heterocyclic compound with a benzotriazole skeleton (a structure that forms a ring by bonding of $R^{11}$ and $R^{12}$ in the compound represented by General Formula (I)) is preferable, and a nitrogen-containing aromatic heterocyclic compound with a benzotriazole skeleton having a substituent on a ring formed by bonding of RH and $R^{12}$ is more preferable.

In addition, as the nitrogen-containing aromatic heterocyclic compound (B), from the viewpoint that anticorrosion properties for a metal layer, the residue removing properties, and the defect suppressing properties are more excellent, the compound represented by General Formula (III) is preferable.

Specific examples of the nitrogen-containing aromatic heterocyclic compound are set for the below, but the present invention is not limited thereto.

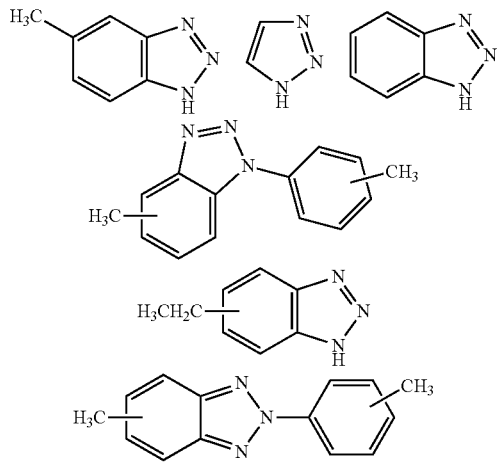

-continued

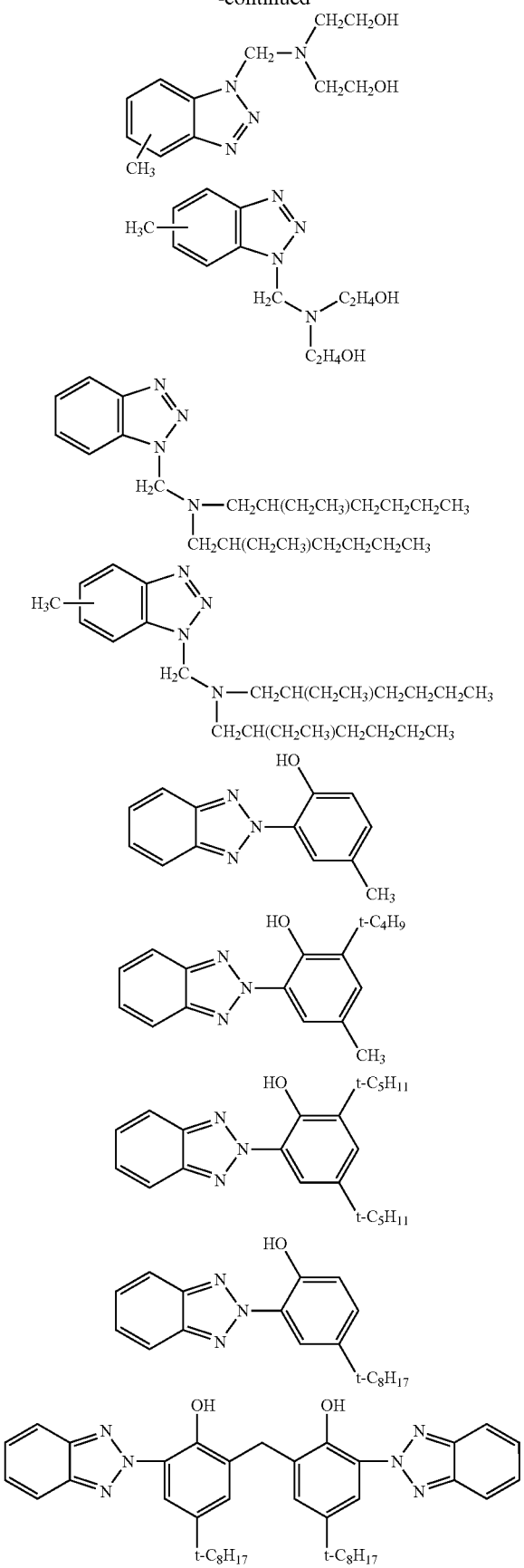

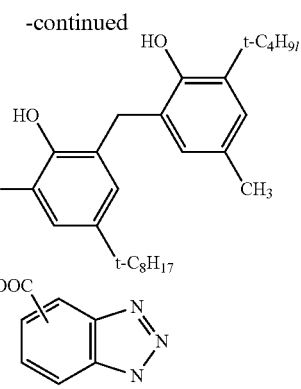

The nitrogen-containing aromatic heterocyclic compound (A) may be used singly or in combination of two or more kinds thereof. Further, the nitrogen-containing aromatic heterocyclic compound (B) may be used singly or in combination of two or more kinds thereof.

From the viewpoint that anticorrosion properties for a metal layer, the residue removing properties, and the defect suppressing properties are all more excellent, the mass content ratio of the nitrogen-containing aromatic heterocyclic compound (A) (the total content thereof in a case where a plurality of kinds of the nitrogen-containing aromatic heterocyclic compounds (A) are present) to the nitrogen-containing aromatic heterocyclic compound (B) (the total content thereof in a case where a plurality of kinds of the nitrogen-containing aromatic heterocyclic compounds (B) are present) in the treatment liquid of the embodiment of the present invention is preferably 1 to 100,000, more preferably 2 to 30,000, and still more preferably 100 to 15,000. In particular, in a case where the mass content ratio is 100 or more, the residue removing properties and the defect suppressing properties are more excellent. In addition, in a case where the mass content ratio is 15,000 or less, the anticorrosion properties for a metal layer is more excellent.

Moreover, in one of suitable aspects of the treatment liquid of the embodiment of the present invention, an aspect in which the nitrogen-containing aromatic heterocyclic compound (B) includes two compounds selected from the group consisting of the compound represented by General Formula (II), the compound represented by General Formula (III), and the compound represented by General Formula (V), and a mass ratio between the two compounds is 1 to 10,000 may be mentioned.

The mass ratio is preferably 10 to 10,000, and more preferably 10 to 1000.

Furthermore, the mass ratio represents a (Mass of the compound having a higher content)/(Mass of the compound having a lower content) between the two compounds. Incidentally, in a case where the contents of the two compounds are the same, the mass ratio is 1.

From the viewpoint that anticorrosion properties, the residue removing properties, and the defect suppressing properties are all more excellent, the content of the nitrogen-containing aromatic heterocyclic compound (B) in the treatment liquid of the embodiment of the present invention is preferably 0.01 to 10,000 ppm by mass, more preferably 0.01 to 1,000 ppm by mass, still more preferably 0.1 to 1,000 ppm by mass, and particularly preferably 0.5 to 80 ppm by mass, with respect to a total mass of the treatment liquid. In particular, in a case where the content of the nitrogen-containing aromatic heterocyclic compound (B) is 0.5 ppm by mass or more with respect to a total mass of the treatment liquid, the anticorrosion properties for a metal layer are more excellent. Incidentally, in a case where the content of the nitrogen-containing aromatic heterocyclic compound (B) is 80 ppm by mass or less with respect to a total mass of the treatment liquid, the residue removing properties and the defect suppressing properties are more excellent.

[Other Components]

The treatment liquid of the embodiment of the present invention may further include other components, in addition to the above-mentioned components. Hereinafter, such other components which can be included in the treatment liquid of the embodiment of the present invention will be described in detail.

<Cobalt Ion>

The treatment liquid of the embodiment of the present invention preferably includes a cobalt ion.

It is considered that in a case where the treatment liquid of the embodiment of the present invention includes the cobalt ion, elution of metals from a metal layer is suppressed due to chemical equilibrium, and as a result, the anticorrosion properties for a metal layer are more excellent. In particular, in a case where the metal layer includes Co, the anticorrosion properties are more excellent.

From the viewpoint that anticorrosion properties for a metal layer (particularly a metal layer including Co), the residue removing properties, and the defect suppressing properties are all more excellent, the content of the cobalt ion in the treatment liquid of the embodiment of the present invention is preferably 0.001 to 10 ppb by mass, more preferably 20 to 3,000 ppt by mass, still more preferably 50 to 2,500 ppt by mass, and particularly preferably 100 to 1,200 ppt by mass, with respect to a total mass of the treatment liquid.

The content of the cobalt ion in the treatment liquid of the embodiment of the present invention is intended to mean a content of the cobalt ion as measured by single nano particle inductively coupled plasma mass spectrometry (SP-ICP-MS).

Here, a device used in the SP-ICP-MS is the same as a device which is ordinary induction bond plasma spectrometry (ICP-MS) (hereinafter also simply referred to as "ICP-MS"), and is only different in data analysis. The data analysis in SP-ICP-MS can be carried out with commercially available software.

In the ICP-MS, the content of the metal components which serve as an object to be measured is measured, irrespective of their forms in which they are present. Accordingly, the total mass of metal particles and metal ions which serve as an object to be measured are quantified as a content of the metal components.

On the other hand, in the SP-ICP-MS, the content of the metal particles is measured. Accordingly, the content of the metal ions in a sample can be calculated by subtracting the content of the metal particles from the content of the metal components in the sample.

That is, the content of the cobalt ion in a sample can be calculated by subtracting the content of the cobalt particles from the content of the cobalt components in the sample.

The contents can be measured by the method described in Examples using, for example, Agilent 8800 triple quadrupole inductively coupled plasma mass spectrometry (ICP-MS, for analyzing a semiconductor, option #200) manufactured by Agilent Technologies Inc. as a device for the SP-ICP-MS. In addition to those, Agilent 8900 manufactured by Agilent Technologies Inc. can also be mentioned, in addition to NexION350S manufactured by PerkinElmer Co., Ltd.

A method for introducing the cobalt ion in the preparation of the treatment liquid of the embodiment of the present invention is not particularly limited. Among those, from the viewpoint that the anticorrosion properties for a metal layer (particularly a metal layer including Co) are more excellent, the cobalt ion in the treatment liquid of the embodiment of the present invention is preferably a cobalt ion derived from at least one cobalt ion source selected from the group consisting of cobalt fluoride, cobalt chloride, cobalt hydroxide, cobalt oxide, and cobalt sulfate. As the cobalt ion source, from the viewpoint that the anticorrosion properties for a metal layer (particularly a metal layer including Co) are more excellent, at least one selected from the group consisting of cobalt hydroxide, cobalt oxide, and cobalt sulfate is more preferable.

Moreover, from the viewpoint that the anticorrosion properties for a metal layer, the residue removing properties, and the defect suppressing properties are all more excellent, the mass content ratio of the above-mentioned nitrogen-containing aromatic heterocyclic compound (B) (the total content thereof in a case where a plurality of kinds of the nitrogen-containing aromatic heterocyclic compounds (B) are present) to the cobalt ion is preferably $1.0 \times 10^2$ to $1.0 \times 10^6$, more preferably $2.0 \times 10^3$ to $5.0 \times 10^5$, still more preferably $3.0 \times 10^3$ to $2.0 \times 10^5$, and particularly preferably $1.0 \times 10^4$ to $1.0 \times 10^5$. In particular, in a case where the mass content ratio is $1.0 \times 10^4$ or more, the residue removing properties and the defect suppressing properties are more excellent. Incidentally, in a case where the mass content ratio is $1.0 \times 10^5$ or less, the anticorrosion properties for a metal layer are more excellent.

In a case where the treatment liquid of the embodiment of the present invention includes the cobalt ion, from the viewpoint that the anticorrosion properties for a metal layer, the residue removing properties, and the defect suppressing properties are all more excellent, in the formulation of the treatment liquid, it is preferable that the content of the water is 10% to 97% by mass with respect to a total mass of the treatment liquid, the content of the organic solvent is 1% to 85% by mass with respect to a total mass of the treatment liquid, the content of the nitrogen-containing aromatic heterocyclic compound is 0.05% to 5% by mass with respect to a total mass of the treatment liquid, and the content of the cobalt ion is 0.001% to 10 ppb by mass with respect to a total mass of the treatment liquid. Further, from the viewpoint that the anticorrosion properties for a metal layer, the residue removing properties, and the defect suppressing properties are all more excellent, the content of the cobalt ion is more preferably 20 to 3,000 ppt by mass, still more preferably 50 to 2,500 ppt by mass, and particularly preferably 100 to 1,200 ppt by mass, with respect to a total mass of the treatment liquid.

<Hydroxylamines>

The treatment liquid of the embodiment of the present invention preferably includes at least one kind of hydroxylamines selected from the group consisting of hydroxylamine ($NH_2$—OH), a hydroxylamine derivative, and a salt thereof. The hydroxylamines have a function of accelerating decomposition and solubilization of the residues.

The hydroxylamine derivative is not particularly limited, but examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

The salt of the hydroxylamine ($NH_2$—OH) and the hydroxylamine derivative is preferably an inorganic acid salt or organic acid salt of the above-mentioned hydroxylamine ($NH_2$—OH) and hydroxylamine derivative, more preferably a salt with an inorganic acid formed by bonding of a non-metal atom such as Cl, S, N, and P with a hydrogen atom, and still more preferably a salt with any one acid of hydrochloric acid, sulfuric acid, or nitric acid.

Among those, hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture thereof is preferable as the inorganic acid salt of the hydroxylamine ($NH_2$—OH) or the hydroxylamine derivative.

Furthermore, examples of the organic acid salt of the hydroxylamine ($NH_2$—OH) or the hydroxylamine derivative include hydroxylammonium citrate, hydroxylammonium oxalate, and hydroxylammonium fluoride.

Among those, from the viewpoint that the residue removing properties are more excellent, hydroxylamine ($NH_2$—OH) is preferable as the hydroxylamines.

The hydroxylamines may be used singly or in combination of two or more kinds thereof.

The content of the hydroxylamines (the total content thereof in a case where a plurality of kinds of the hydroxylamines are present) is usually 0.01% to 30% by mass with respect to a total mass of the treatment liquid. From the viewpoint that the residue removing properties are more excellent, the lower limit of the content is preferably 1.0% by mass or more, and more preferably 2.0% by mass or more. Among those, from the viewpoint that excellent residue removing properties and excellent anticorrosion properties for a metal layer are both satisfied, the content of the hydroxylamines is more preferably 2.0% to 10% by mass with respect to a total mass of the treatment liquid.

<Fluorine-Containing Compound>

The treatment liquid of the embodiment of the present invention preferably includes one or more fluorine-containing compounds selected from the group consisting of hydrofluoric acid, ammonium fluoride, tetramethylammonium fluoride, and tetrabutylammonium fluoride. The fluorine-containing compound has a function of removing residues in the treatment liquid of the embodiment of the present invention. As a result, in a case where the treatment liquid includes the fluorine-containing compound, the residue removing properties are more excellent.

As the fluorine-containing compound, hydrofluoric acid is preferable.

The fluorine-containing compound may be used singly or in combination of two or more kinds thereof.

The content of the fluorine-containing compound (the total content thereof in a case where a plurality of kinds of the fluorine-containing compounds are present) in the treatment liquid of the embodiment of the present invention is preferably 0.01% to 5.0% by mass, and more preferably 0.1% to 2.0% by mass, with respect to a total mass of the treatment liquid.

Moreover, from the viewpoint that the anticorrosion properties for a metal layer, the residue removing properties, and the defect suppressing properties are all more excellent, the mass content ratio of the above-mentioned fluorine-containing compound (the total content thereof in a case where a plurality of kinds of the fluorine-containing compounds are present) to the cobalt ion is preferably $1.0 \times 10^5$ to $1.0 \times 10^8$, more preferably $3.0 \times 10^6$ to $8.0 \times 10^7$, and still more preferably $4.0 \times 10^6$ to $5.0 \times 10^7$. In particular, in a case where the mass content ratio is $4.0 \times 10^6$ to $5.0 \times 10^{17}$, the residue removing properties are more excellent.

<Basic Compound>

The treatment liquid of the embodiment of the present invention preferably includes a basic compound. The basic compound functions as a pH adjuster in the treatment liquid.

The basic compound is intended to mean a compound that adjusts the pH of a solution to 9 or more as 1 g of the basic compound is dissolved in 100 g of water.

Furthermore, in the present specification, the above-mentioned hydroxylamines and a quaternary ammonium hydroxide which will be described later are construed to be not included in the basic compound.

Moreover, from the viewpoint that the anticorrosion properties for a metal layer, the residue removing properties, and the defect suppressing properties are all more excellent, the mass content ratio of the above-mentioned basic compound to the cobalt ion (the total content thereof in a case where a plurality of kinds of the cobalt ions are present) is preferably $1.0 \times 10^5$ to $1.0 \times 10^9$, and more preferably $1.0 \times 10^7$ to $1.0 \times 10^8$. In particular, in a case where the mass content ratio is $1.0 \times 10^7$ or more, the residue removing properties and the defect suppressing properties are more excellent. Incidentally, in a case where the mass content ratio is $1.0 \times 10^8$ or less, the anticorrosion properties for a metal layer are more excellent.

The basic compound is not particularly limited, but from the viewpoint that the residue removing properties are more excellent and the anticorrosion properties for a metal layer are also more excellent, a nitrogen-containing alicyclic compound, ammonium hydroxide, or a secondary amine is preferable, and the nitrogen-containing alicyclic compound or the secondary amine is more preferable.

Hereinafter, each of the nitrogen-containing alicyclic compounds, the ammonium hydroxide, and the secondary amine will be described in detail.

(Nitrogen-Containing Alicyclic Compound)

Examples of the nitrogen-containing alicyclic compound include 1,8-diazabicyclo[5.4.0]-7-undecene (DBU), ε-caprolactam, the following compound 1, the following compound 2, the following compound 3, 1,4-diazabicyclo[2.2.2]octane (DABCO), tetrahydrofurfurylamine, N-(2-aminoethyl)piperazine, hydroxyethylpiperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4.3.0]-5-nonene.

Compound 1

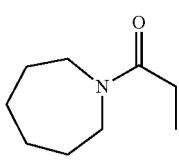

Compound 2

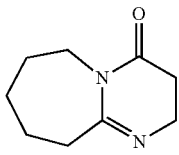

Compound 3

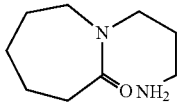

Among those, from the viewpoint that the residue removing properties are more excellent and the anticorrosion properties for a metal layer are also more excellent, 1,8-diazabicyclo[5.4.0]-7-undecene (DBU), tetrahydrofurfurylamine, N-(2-aminoethyl)piperazine, or 1,4-diazabicyclo[2.2.2]octane (DABCO) is preferable as the nitrogen-containing alicyclic compound.

Moreover, as the nitrogen-containing alicyclic compound, one or more selected from the group consisting of 1,8-diazabicyclo[5.4.0]-7-undecene (DBU), ε-caprolactam, the compound 1, the compound 2, and the compound 3 is preferably used in combination. In a case where the treatment liquid of the embodiment of the present invention includes one or more selected from the group consisting of 1,8-diazabicyclo[5.4.0]-7-undecene (DBU), ε-caprolactam, the compound 1, the compound 2, and the compound 3, the anticorrosion properties for a metal layer, the residue removing properties, and the defect suppressing properties are more excellent. Incidentally, in a case where the treatment liquid of the embodiment of the present invention includes one or more selected from the group consisting of 1,8-diazabicyclo[5.4.0]-7-undecene (DBU), ε-caprolactam, the compound 1, the compound 2, and the compound 3, from the viewpoint that anticorrosion properties for a metal layer, the residue removing properties, and the defect suppressing properties are more excellent, ε-caprolactam, the mass ratio of the total content of the compound 1, the compound 2, and the following compound 3 with respect to a total content of 1,8-diazabicyclo[5.4.0]-7-undecene (DBU) is preferably 0.0001 to 0.3, and more preferably 0.001 to 0.05.

The nitrogen-containing alicyclic compound may be used singly or in combination of two or more kinds thereof.

The content of the nitrogen-containing alicyclic compound (the total content thereof in a case where a plurality of kinds of the nitrogen-containing alicyclic compounds are present) is not particularly limited, but is preferably 0.01% to 10% by mass, and more preferably 0.1% to 5.0% by mass, with respect to a total mass of the treatment liquid.

(Ammonium Hydroxide)

In a case where ammonium hydroxide ($NH_4OH$) is included as the basic compound, a content thereof is not particularly limited, but is preferably 0.1% to 10% by mass, and more preferably 0.1% to 5.0% by mass, with respect to a total mass of the treatment liquid.

(Secondary Amine)

The secondary amine only needs to include a secondary amino group, and examples thereof include 2,2'-iminodiethanol. Further, the secondary amine does not include a nitrogen-containing alicyclic compound.

The content of the secondary amine is not particularly limited, but is preferably 300 ppb by mass to 3,000 ppm by mass, more preferably 1 to 1,000 ppm by mass, and still more preferably 10 to 500 ppm by mass, with respect to a total mass of the treatment liquid.

Furthermore, a ratio of the mass of the nitrogen-containing aromatic heterocyclic compound (B) to the mass of the secondary amine is not particularly limited, but is preferably 1 to 10,000, more preferably 5 to 10,000, still more preferably 5 to 5,000, and particularly preferably 5 to 1,000.

<Chelating Agent>

The treatment liquid of the embodiment of the present invention preferably includes a chelating agent.

The chelating agent has a function of forming a chelate with an oxidized metal included in the residues.

In a case where the treatment liquid of the embodiment of the present invention includes a chelating agent, the residue removing properties and the defect suppressing properties are more excellent.

The chelating agent is not particularly limited, but is preferably a polyaminopolycarboxylic acid.

The polyaminopolycarboxylic acid is a compound having a plurality of amino groups and a plurality of carboxylic acid groups, and examples thereof include a monoalkylenepolyamine polycarboxylic acid, a polyalkylenepolyamine polycarboxylic acid, a polyaminoalkane polycarboxylic acid, a polyaminoalkanol polycarboxylic acid, and a hydroxyalkyl ether polyamine polycarboxylic acid.

Suitable examples of the chelating agent of the polyaminopolycarboxylic acid include butylenediaminetetraacetic acid, diethylenetriaminepentaacetic acid (DTPA), ethylenediaminetetrapropionic acid, triethylenetetraaminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid. Among those, diethylenetriamine pentaacetic acid (DTPA), ethylenediamine tetraacetic acid (EDTA), and trans-1,2-diaminocyclohexane tetraacetic acid are preferable.

The chelating agent may be used singly or in combination of two or more kinds thereof.

The content of the chelating agent (the total content thereof in a case where a plurality of kinds of the chelating agents are present) is not particularly limited, but is preferably 0.01% to 10% by mass, and more preferably 0.01% to 3.0% by mass, with respect to a total mass of the treatment liquid.

<Quaternary Ammonium Hydroxide>

The treatment liquid of the embodiment of the present invention preferably includes a quaternary ammonium hydroxide. The quaternary ammonium hydroxide functions as a pH adjuster in the treatment liquid.

Examples of the quaternary ammonium hydroxide compounds include a compound represented by Formula (a1).

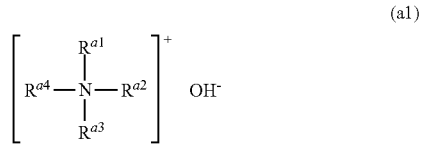

(a1)

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}$ to $R^{a4}$ together may be bonded to each other to form a cyclic structure, and in particular, in at least one of a combination of $R^{a1}$ and $R^{a2}$ or a combination of $R^{a3}$ and $R^{a4}$, the two groups may be bonded to each other to form a cyclic structure.

Among the compounds represented by Formula (a1), at least one selected from the group consisting of tetramethylammonium hydroxide, tetraethylammonium hydroxide, tetrapropylammonium hydroxide, tetrabutylammonium hydroxide, methyltripropylammonium hydroxide, methyltributylammonium hydroxide, ethyltrimethylammonium hydroxide, dimethyl di ethyl ammonium hydroxide, benzyltrimethylammonium hydroxide, hexadecyltrimethylammonium hydroxide, (2-hydroxyethyl)trimethylammonium hydroxide, and spiro-(1,1')-bipyrrolidinium hydroxide is preferable from the viewpoint of easy availability. Among those, tetramethylammonium hydroxide, tetrabutylammonium hydroxide, or benzyltrimethylammonium hydroxide is more preferable.

The quaternary ammonium hydroxide may be used singly or in combination of two or more kinds thereof.

The content of the quaternary ammonium hydroxide is preferably 0.05% to 15% by mass, and more preferably 0.1% to 12% by mass, with respect to a total mass of the treatment liquid.

<Other Additives>

Furthermore, examples of other additives include an anticorrosive agent, a surfactant, an antifoaming agent, a rust inhibitor, and a preservative, which are other than the nitrogen-containing aromatic ring compound. The anticorrosive agent other than the nitrogen-containing aromatic ring compound is not particularly limited, and for example, a known compound such as thioglycerol can be used.

[Physical Properties of Treatment Liquid]

<pH>

The treatment liquid of the embodiment of the present invention preferably has a pH of 2 to 15. By setting the pH of treatment liquid to 2 to 15, it is possible to satisfy both of the anticorrosion properties and the washing properties to more excellent levels even in a case where the metal layer is formed of any material of Co, Cu, or W.

From the viewpoint that the residue removing properties are more excellent, the lower limit value of the pH of the treatment liquid is preferably 3 or more, and more preferably 4 or more.

From the viewpoint that the anticorrosion properties for a metal layer are more excellent, the upper limit value of the pH of the treatment liquid is preferably 15 or less, and more preferably 13 or less.

The pH of the treatment liquid can be measured using a known pH meter.

<Coarse Particles>

It is preferable that the treatment liquid of the embodiment of the present invention substantially does not include coarse particles.

The coarse particles refer to particles having a diameter of 0.2 μm or more, for example, in a case of considering the shapes of the particles as spheres. Further, an expression, substantially not including coarse particles, indicates that the number of particles having a diameter of 0.2 μm or more in 1 mL of the treatment liquid in a case where measurement of the treatment liquid using a commercially available measuring device in a light scattering type in-liquid particle measurement method system is carried out is 10 or less.

Furthermore, the coarse particles included in the treatment liquid are particles of dirt, dusts, organic solids, inorganic solids, and the like which are included as impurities in raw materials; particles of dirt, dusts, organic solids, inorganic solids, and the like which are incorporated as a contaminant during the preparation of a treatment liquid; and the like, and correspond to the particles which are not ultimately dissolved in the treatment liquid and are present in the form of particles.

The amount of the coarse particles present in the treatment liquid can be measured in a liquid phase using a commercially available measuring device in a light scattering type in-liquid particle measurement system with a laser as a light source.

Examples of a method for removing the coarse particles include a treatment such as filtering.

[Kit and Concentrate]

The treatment liquid may be used in the form of a kit in which the raw materials are separated into multiple partitions. Although not being particularly limited, examples of a specific method for using the treatment liquid in the form of the kit include an aspect in which in a case where the treatment liquid includes water, an organic solvent, two or more nitrogen-containing aromatic heterocyclic compounds, hydroxylamines, or a basic compound, a liquid composition containing a hydroxylamine compound and the basic compound in water is prepared as a first liquid, and a liquid composition containing the two or more nitrogen-containing aromatic heterocyclic compounds in the organic solvent is prepared as a second liquid.

In addition, the treatment liquid may be prepared as a concentrate. In this case, the treatment liquid can be used after being diluted with a dilute solution. Further, from the viewpoint that the defect removing properties are more excellent, it is preferable that the concentrate is diluted with water, isopropanolamine, or a dilute solution including ammonia. That is, a kit having the treatment liquid in the form of the concentrate and the dilute solution is available.

[Applications]

Next, the applications of the treatment liquid relating to the embodiments will be described.

The treatment liquid is a treatment liquid for a semiconductor device. In the present specification, the expression, "for a semiconductor device", means a use in the manufacture of a semiconductor device. The treatment liquid can also be used in any steps for manufacturing a semiconductor device, and can also be used in treatments of, for example, an insulating film, a resist film, an antireflection film, an etching residue, and an ashing residue, which are present on a substrate. Further, in the present specification, the etching residue and the ashing residue are collectively referred to as residues. In addition, the treatment liquid may be used in a treatment of a substrate after chemical mechanic polishing, and may also be used as an etching liquid.

The treatment liquid is specifically used as a pre-wet liquid to be applied on a substrate in order to improve the coatability of an actinic ray-sensitive or radiation-sensitive composition before a step of forming a resist film by using the composition; a washing liquid to be used for the removal of residues adhering onto a metal layer, or the like; a solution (for example, a remover liquid and a peeling liquid) to be used for the removal of various resist films for pattern formation; a solution (for example, a remover liquid and a peeling liquid) to be used for the removal of a permanent film (for example, a color filter, a transparent insulating film, and a resin-made lens), or the like from a semiconductor substrate; or the like. Further, since the semiconductor substrate after the removal of the permanent film is used again in a case of using a semiconductor device in some cases, the removal of the permanent film shall be included in the step for manufacturing a semiconductor device.

Furthermore, the treatment liquid can also be used as a washing liquid to be used for the removal of residues such as metal impurities and fine particles from a substrate after chemical mechanic polishing.

In addition, the treatment liquid can also be used as an etching liquid for cobalt oxide, copper oxide, or the like.

Among those applications, the treatment liquid can be particularly used as a washing liquid for removing etching residues, a solution for removing a resist film used for pattern formation, a washing liquid for removing residues from a substrate after chemical mechanical polishing, or an etching liquid.

Among the applications, the treatment liquid of the embodiment of the present invention may be used in only one application or two or more applications of the applications.

The treatment liquid can also be used for a treatment of a substrate in a semiconductor device comprising a metal layer including Co, a substrate in a semiconductor device comprising a metal layer including W, or a substrate in a semiconductor device comprising a metal layer including Cu. In addition, since the treatment liquid has excellent anticorrosion properties for an interlayer insulating film, it can also be used for, for example, a treatment of a substrate in a semiconductor device comprising a layer at least one selected from the group consisting of $SiO_x$, SiN, and SiOC (x is a number of 1 to 3).

[Treatment Liquid, Concentrate, and Method for Producing Kit]

<Step of Preparing Liquid>

A method for producing the treatment liquid is not particularly limited, and a known production method can be used. Examples of the method for producing the treatment liquid include a method in which the respective components are mixed.

Furthermore, an order of mixing the respective components is not particularly limited. The concentrate and the kit are also preferably produced by the same method as described above.

<Filtering Step>

The production method preferably includes a filtering step of filtering a liquid in order to remove foreign matters, coarse particles, and the like from the liquid.

The filtering method is not particularly limited and known filtering methods can be used. Among those, filtering using a filter is preferable.

As a filter used for filtering, any filter which has been used in the filtering applications or the like from the related art can be used without particular limitation. Examples of the materials constituting the filter include fluorine resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among these materials, polyamide-based resins, PTFE, and polypropylene (including high-density polypropylene) are preferable.

By using a filter formed with these materials, high-polarity foreign matters which are likely to cause defects can be more effectively removed from the treatment liquid.

For the critical surface tension of the filter, the lower limit value is preferably 70 mN/m or more, and the upper limit value is preferably 95 mN/m or less. In particular, the critical surface tension of the filter is preferably 75 to 85 mN/m.

In addition, the value of the critical surface tension is a nominal value of a manufacturer. High-polarity foreign matters which are likely to cause defects can be more effectively removed from the treatment liquid by using a filter having a critical surface tension in the range.

The pore diameter of the filter is preferably approximately 0.001 to 1.0 µm more preferably approximately 0.02 to 0.5 µm, and more preferably approximately 0.01 to 0.1 µm. It is possible to reliably remove fine foreign matters contained in the treatment liquid while suppressing clogging in filtering by adjusting the pore diameter of the filter to be in the range.

In a case of using filters, different filters may be combined. At that time, the filtering with the first filter may be performed once or twice or more times. In a case where the filtering is performed twice or more times by combining different filters, the respective filters may be of the same kinds or of different kinds from each other, and are preferably of different kinds from each other. Typically, it is preferable that the first filter and the second filter are different in at least one of the pore diameter or the constituent materials.

The pore diameter at the second filtering or later is preferably the same as or smaller than the pore diameter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PE•clean filter (pore diameter of 0.02 μm)"; (manufactured by Nihon Pall Ltd.), and a high-density polyethylene-made "PE•clean filter (pore diameter of 0.01 μm)"; (manufactured by Nihon Pall Ltd.) can also be used.

As the second filter, a filter formed of the same materials as those of the first filter can be used. A filter having the same pore diameter as that of the above-mentioned first filter can be used. In a case of using the second filter having a smaller pore diameter than that of the first filter, the ratio of the pore diameter of the second filter to the pore diameter of the first filter (pore diameter of second filter/pore diameter of first filter) is preferably 0.01 to 0.99, more preferably 0.1 to 0.9, and still more preferably 0.3 to 0.9. Fine foreign matters incorporated into the treatment liquid are more reliably removed by adjusting the pore diameter of the second filter to be in the range.

For example, filtering using a first filter may be performed with a mixed liquid including some components of the treatment liquid, the residual components may be mixed therewith to prepare a treatment liquid, and then second filtering may be carried out.

Moreover, the filter used is preferably treated before filtering the treatment liquid. The liquid used in this treatment is not particularly limited, but the liquid used for the treatment is preferably a liquid including a treatment liquid, a concentrate, and the components contained in the treatment liquid.

In a case of performing the filtering, the upper limit value in the temperature during the filtering is preferably room temperature (25° C.) or lower, more preferably 23° C. or lower, and still more preferably 20° C. or lower. Further, the lower limit value in the temperature during the filtering is preferably 0° C. or higher, more preferably 5° C. or higher, and still more preferably 10° C. or higher.

In the filtering, particulate foreign matters and/or impurities can be removed, but in a case of performing the filtering at the temperature, the amounts of the particulate foreign matters and/or impurities dissolved in the treatment liquid are reduced, and therefore, the filtering is more efficiently performed.

<Charge Eliminating Step>

The production method may further include a charge eliminating step of subjecting at least one selected from the group consisting of a treatment liquid, a concentrate, and a kit to charge elimination. Further, a specific method for charge elimination will be described later.

Moreover, it is preferable that all the steps in the production method are performed in clean rooms. The clean rooms preferably satisfy the standards of International Standards Organization (ISO) 14644-1 clean room. The clean rooms preferably satisfy any one of ISO Class 1, ISO Class 2, ISO Class 3, or ISO Class 4, more preferably satisfy either ISO Class 1 or ISO Class 2, and still more preferably satisfy ISO Class 1.

A container storing the above-mentioned treatment liquid, concentrate, or kit is not particularly limited as long as it has no problem with corrosiveness with a liquid, and a known container can be used.

As for the container, a container which has high cleanliness in the container and less elution of impurities is preferable as a container used in semiconductor applications.

Specific examples of the container include "CLEAN BOTTLE" series (manufactured by Aicello Chemical Co., Ltd.) and "PURE BOTTLE" (manufactured by Kodama Plastics Co., Ltd.). Further, it is also preferable to use a multilayer container having a 6-layer structure with an inner wall formed from six kinds of resins or a multilayer container having a 7-layer structure formed from 6 kinds of resins for the purpose of preventing incorporation (contamination) of impurities into raw materials and compositions. Examples of such the container include, but are not limited to, the containers described in JP2015-123351A.

It is preferable that the inner wall of the container is formed of a different resin other than one or more resins selected from the group consisting of a polyethylene resin, a polypropylene resin, and a polyethylene-polypropylene resin or is formed of a metal which is treated to inhibit rust and to prevent metal elution, for example, stainless steel, HASTELLOY, INCONEL, or MONEL.

As such other resins, a fluorine-based resin (perfluororesin resin) can be preferably used. In this manner, by using a container having an inner wall formed of a fluorine-based resin or a container coated with a fluorine resin, occurrence of problems such as the elution of oligomers of ethylene, propylene, or the like can be suppressed, as compared to a case where a container having an inner wall formed of or coated with a polyethylene resin, a polypropylene resin, or a polyethylene-polypropylene resin is used.

Specific examples of the container having such an inner wall include a FluoroPurePFA composite drum manufactured by Entegris Inc. Further, the containers described in page 4 and the like of JP1991-502677A (JP-H03-502677A), page 3 and the like of WO2004/016526A, or pages 9 and 16, and the like of WO99/046309A can also be used.

Moreover, for the inner wall of the container, quartz and an electropolished metal material (that is, a metal material which has been completely electropolished) are also preferably used, in addition to the above-mentioned fluorine-based resin.

The metal material used in the production of the electropolished metal material is preferably a metal material which includes at least one selected from the group consisting of chromium and nickel, and has a total content of chromium and nickel of more than 25% by mass with respect to a total mass of the metal material, and examples of the metal material include stainless steel and a nickel-chromium alloy.

The total content of chromium and nickel in the metal material is preferably 25% by mass or more, and more preferably 30% by mass or more, with respect to a total mass of the metal material.

In addition, the upper limit value of the total content of chromium and nickel in the metal material is not particularly limited, but in general, it is preferably 90% by mass or less.

The stainless steel is not particularly limited, and known stainless steel can be used. Among those, an alloy including 8% by mass or more of nickel is preferable, and austenitic stainless steel including 8% by mass or more of nickel is more preferable. Examples of the austenitic stainless steel include Steel Use Stainless (SUS) 304 (Ni content of 8% by mass, Cr content of 18% by mass), SUS 304 L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

The nickel-chromium alloy is not particularly limited and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy-C (Ni content of 60% by mass, Cr content of 17% by mass), and Hastelloy C-22 (Ni content of 61% by mass, Cr content of 22% by mass).

In addition, the nickel-chromium alloy may further include boron, silicon, tungsten, molybdenum, copper, cobalt, or the like, as desired, in addition to the above-mentioned alloys.

A method for electropolishing the metal material is not particularly limited, and known methods can be used. For example, the methods described in paragraphs <0011> to <0014> of JP2015-227501A, paragraphs <0036> to <0042> of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, a treatment liquid having a reduced amount of specific metal elements can be obtained.

In addition, it is preferable that the metal material is buffed. The buffing method is not particularly limited, and known methods can be used. The size of the abrasive grain used to finish the buffing is not particularly limited, but is preferably #400 or less from the viewpoint that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of the abrasive grains.

For the container, it is preferable to wash the inside of the container before filling. The liquid used for washing may be appropriately selected depending on application, but is preferably the treatment liquid, a liquid obtained by diluting the treatment liquid, or a liquid including at least one of the components added to the treatment liquid.

For the purpose of preventing the changes in the components in the treatment liquid during storage, the inside of the container may be purged with inert gas (nitrogen, argon, or the like) with a purity of 99.99995% by volume or more. In particular, a gas having a low moisture content is preferable. In addition, during transportation or storage of the liquid housing body, the temperature may be a normal temperature, but may also be controlled to a temperature in the range of −20° C. to 20° C. to prevent deterioration.

[Method for Washing Substrate]

The method for washing a substrate of an embodiment of the present invention includes a washing step B of washing a predetermined substrate using the treatment liquid. Further, the method for washing a substrate may include a treatment liquid preparing step A of preparing the treatment liquid before the washing step B.

In the following description of the method for washing a substrate, a case where the treatment liquid preparing step A is carried out before the washing step B is presented by way of an example, but is not restrictive, and the method for washing a substrate of the embodiment of the present invention may be performed using the treatment liquid that has been prepared in advance.

[Object to Be Washed]

In an embodiment, it is preferable that an object to be washed in the method for washing a substrate comprises a metal layer including Co.

Moreover, in an embodiment, it is preferable that the object to be washed in the method for washing a substrate comprises a metal layer including W.

Furthermore, in an embodiment, it is preferable that the object to be washed in the method for washing a substrate comprises a metal layer including Cu.

Examples of the object to be washed include a laminate comprising at least a metal layer, an interlayer insulating film, and a metal hard mask in this order on a substrate. The laminate may have holes formed toward the substrate from the surface (apertures) of the metal hard mask so as to expose the surface of the metal layer through a dry etching step or the like.

A method for producing the laminate having holes as described above is not particularly limited, but examples thereof usually include a method in which a laminate before the treatment, having a substrate, a metal layer, an interlayer insulating film, and a metal hard mask in this order, is subjected to a dry etching step using the metal hard mask as a mask, and the interlayer insulating film is etched so as to expose the surface of the metal layer to provide holes passing through the inside of the metal hard mask and the interlayer insulating film.

Furthermore, a method for producing the metal hard mask is not particularly limited, and examples thereof include a method in which a metal layer including predetermined components is firstly formed on an interlayer insulating film, and a resist film having a predetermined pattern is formed thereon. Next, the metal layer is etched using the resist film as a mask to produce a metal hard mask (that is, a film with a metal layer which is patterned).

In addition, the laminate may have layers other than the above-mentioned layer, and examples of such other layers include an etching stop film and an antireflection layer.

FIG. 1 illustrates a schematic cross-sectional view showing an example of a laminate which is an object to be washed in the method for washing a substrate.

A laminate 10 shown in FIG. 1 comprises a metal layer 2, an etching stop layer 3, an interlayer insulating film 4, and a metal hard mask 5 in this order on a substrate 1, and has holes 6 through which the metal layer 2 is exposed at predetermined positions by performing a dry etching step and the like. That is, the object to be washed shown in FIG. 1 is a laminate comprising the substrate 1, the metal layer 2, the etching stop layer 3, the interlayer insulating film 4, and the metal hard mask 5 in this order, and comprising the holes 6 passing through the surface of the metal hard mask 5 at aperture positions thereof to the surfaces of the metal layer 2. The inner wall 11 of the hole 6 is constituted of a cross-sectional wall 11a formed of the etching stop layer 3, the interlayer insulating film 4, and the metal hard mask 5, and a bottom wall 11b formed of the exposed metal layer 2, and dry etching residues 12 adhere thereto.

The method for washing a substrate can be suitably used for washing intended to remove the dry etching residues 12 of the substrate. That is, the performance for removing the dry etching residues 12 (residue removing capability) is excellent, and the anticorrosion properties for the inner wall 11 (for example, the metal layer 2) of the object to be washed are also excellent.

In addition, the method for washing a substrate may also be carried out for the laminate which has been subjected to a dry ashing step after the dry etching step.

Hereinafter, materials constituting the respective layer of the above-mentioned laminate will be described.

<Metal Hard Mask>

The metal hard mask preferably includes at least one component selected from the group consisting of Cu, Co, a Co alloy, W, a W alloy, Ru, an Ru alloy, Ta, a Ta alloy, AlOx, AlN, AlOxNy, TiAl, Ti, TiN, TiOx, ZrOx, HfOx, TaOx, LaOx, and YSiOx. Here, x and y are preferably a number satisfying x=1 to 3 and a number satisfying y=1 or 2, respectively.

Examples of the materials of the metal hard mask include TiN, $WO_2$, and $ZrO_2$.

<Interlayer Insulating Film>

A material for the interlayer insulating film is not particularly limited, and examples thereof include a material, preferably having a dielectric constant k of 3.0 or less, and more preferably having a dielectric constant k of 2.6 or less.

Specific examples of the material for the interlayer insulating film include $SiO_x$, SiN, SiOC, and organic polymers such as a polyimide. Incidentally, x is preferably a number indicating 1 to 3.

<Etching Stop Layer>

A material for the etching stop layer is not particularly limited. Specific examples of the material for the etching stop layer include metal oxides such as SiN—, SiON—, and SiOCN-based materials, and AlOx.

<Metal Layer>

A material forming the metal layer preferably includes one or more selected from the group consisting of cobalt, tungsten, and copper. Moreover, the material may be an alloy with a metal other than cobalt, tungsten, and copper.

The wiring material of the present invention may further include a metal other than cobalt, tungsten, and copper, metal nitride, or an alloy. Specific examples thereof include titanium, titanium-tungsten, titanium nitride, tantalum, a tantalum compound, chromium, chromium oxide, and aluminum.

<Substrate>

A term "substrate" as mentioned herein encompasses, for example, a semiconductor substrate formed of a single layer and a semiconductor substrate formed of multiple layers.

A material constituting the semiconductor substrate formed of a single layer is not particularly limited, and in general, the semiconductor substrate is preferably formed of silicon, silicon germanium, Group III to V compounds such as GaAs, and any combinations thereof.

In a case of a semiconductor substrate formed of multiple layers, its configuration is not particularly limited, and the substrate may have, for example, exposed integrated circuit structures including interconnect features and the like, such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, an interlayer dielectric layer, a silicon oxide layer, a silicon nitride layer, a silicon carbide layer, a carbon-doped silicon oxide layer, or the like may be included on the semiconductor substrate.

Hereinafter, each of the steps in the method for washing a substrate will be described.

[Treatment Liquid Preparing Step A]

The treatment liquid preparing step A is a step in which the treatment liquid is prepared. The respective components used in the present step are as described above.

The procedure of the present step is not particularly limited, and examples thereof include a method in which predetermined components are stirred and mixed to prepare a treatment liquid. Further, the respective components may be added at once or may be added in portions over a plurality of times.

In addition, as the respective components included in the treatment liquid, components classified into a semiconductor grade or components classified into a high-purity grade equivalent thereto are preferably used, and components which have been subjected to removal of foreign matters by filtering and/or reduction in ion components with an ion exchange resin or the like are preferably used. Further, it is preferable that the raw material components are mixed and then subjected to removal of foreign matters by filtering and/or reduction in ion components with an ion exchange resin or the like are used.

Furthermore, in a case where the treatment liquid is used in the form of a concentrate, a dilute solution is obtained by diluting the treatment liquid 5 to 2,000 folds after carrying out the washing step B, and then the dilute solution is used to carry out the washing step B. As a solvent for diluting the concentrate, water or isopropanolamine is preferable.

[Washing Step B]

Examples of an object to be washed in the washing step B include the above-mentioned laminate, and examples thereof include the laminate 10 having holes formed by carrying out a dry etching step as described above (see FIG. 1). Further, the dry etching residues 12 adhere to the inside of the holes 6 in the laminate 10.

In addition, the laminate which has been subjected to a dry ashing step after the dry etching step may be used as an object to be washed.

A method for bringing the treatment liquid into contact with the object to be washed is not particularly limited, but examples thereof include a method in which an object to be washed is immersed in a treatment liquid contained in a tank, a method in which a treatment liquid is sprayed onto an object to be washed, a method in which a treatment liquid is flowed onto an object to be washed, and any combinations thereof. From the viewpoint of the residue removing properties, the method in which an object to be washed is immersed in a treatment liquid is preferable.

A temperature of the treatment liquid is preferably set to 90° C. or lower, more preferably set to 25° C. to 80° C., still more preferably set to 30° C. to 75° C., and particularly preferably set to 40° C. to 65° C.

The washing time can be adjusted depending on the washing method used and the temperature of a treatment liquid.

In a case where washing is performed in an immersion batch mode (a batch mode in which a plurality of sheets of object to be washed are immersed in a treatment tank to perform a treatment), the washing time is, for example, 60 minutes or less, preferably 1 to 60 minutes, more preferably 3 to 20 minutes, and still more preferably 4 to 15 minutes.

In a case where sheet-type washing is performed, the washing time is, for example, 10 seconds to 5 minutes, preferably 15 seconds to 4 minutes, more preferably 15 seconds to 3 minutes, and still more preferably 20 seconds to 2 minutes.

Furthermore, in order to enhance the washing capability of the treatment liquid, a mechanical stirring method may be used.

Examples of the mechanical stirring method include a method in which a treatment liquid is circulated on an object to be washed, a method in which a treatment liquid is flowed through or sprayed on an object to be washed, and a method in which a treatment liquid is stirred with an ultrasonic or a megasonic.

[Rinsing Step B2]

The method for washing a substrate of the embodiment of the present invention may further have a step in which the object to be washed is cleaned by rinsing with a solvent (hereinafter referred to as a "rinsing step B2") after the washing step B.

The rinsing step B2 is preferably a step which is performed subsequently after the washing step B, and rinsing is performed with a rinsing solvent (rinsing liquid) over 5 seconds to 5 minutes. The rinsing step B2 may be performed using the above-mentioned mechanical stirring method.

Examples of the rinsing solvent include deionized water (DI) water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, DI water, methanol, ethanol, or isopropyl alcohol is preferable, the aqueous ammonium hydroxide solution, DI water, or isopropyl alcohol is more preferable, and the aqueous ammonium hydroxide solution or DI water is still more preferable.

As a method for bringing the rinsing solvent into contact with the object to be washed, the above-mentioned method in which the treatment liquid is brought into contact with an object to be washed can be applied in the same manner.

The temperature of the rinsing solvent in the rinsing step B2 is preferably 16° C. to 27° C.

[Drying Step B3]

The method for washing a substrate of the embodiment of the present invention may have a drying step B3 in which the object to be washed is dried after the rinsing step B2.

A drying method is not particularly limited. Examples of the drying method include a spin drying method, a method of flowing a dry gas onto an object to be washed, a method of heating a substrate by a heating means such as a hot plate or an infrared lamp, a Marangoni drying method, a Rotagoni drying method, an isopropyl alcohol (IPA) drying method, or any combinations thereof.

The drying time depends on a specific method to be used, but in general, it is preferably 30 seconds to several minutes.

[Coarse Particle Removing Step H]

The method for washing a substrate preferably has a coarse particle removing step H in which the coarse particles in the treatment liquid are removed after the treatment liquid preparing step A and before the washing step B.

By reducing or removing the coarse particles in the treatment liquid, it is possible to reduce the amount of the coarse particles remaining on the object to be washed obtained after performing the washing step B. As a result, pattern damages caused by the coarse particles on the object to be washed can be suppressed, and an influence on the decrease in a yield of a device and the decrease in reliability can also be suppressed.

Examples of a specific method for removing the coarse particle include a method in which the treatment liquid which has been subjected to the treatment liquid preparing step A is purified by filtering the treatment liquid using a particle removing film having a predetermined particle removal diameter.

In addition, the definition of the coarse particles is as described above.

[Charge Eliminating Steps I and J]

The method for washing a substrate preferably includes at least one step selected from the group consisting of a charge eliminating step I in which water used in preparation of the treatment liquid is subjected to charge elimination before the treatment liquid preparing step A, and a charge eliminating step J in which the treatment liquid is subjected to charge elimination after the treatment liquid preparing step A and before the washing step B.

It is preferable that a material for a liquid contact portion for supplying the treatment liquid to the object to be washed is formed of or coated with a material having no metal elution to the treatment liquid. Examples of the material include the materials described above as a material for an inner wall of a container that can be used in a liquid housing body.

In addition, the material may be a resin. In a case where the material is a resin, the resin has a low electrical conductivity and insulating properties in many cases. Thus, for example, in a case where the treatment liquid is passed through a pipe having an inner wall formed with or coated with a resin, or in a case where a resin-made particle removing film and a resin-made ion-exchange resin film are subjected to purification through filtration, there is a risk that the charging potential of the treatment liquid increases to cause static electricity hazards.

As a result, in the method for washing a substrate of the embodiment of the present invention, it is preferable that at least one step of the above-mentioned charge eliminating step I or charge eliminating step J is carried out to reduce the charging potential of the treatment liquid. Further, by performing charge elimination, it is possible to further suppress the adherence of foreign matters (coarse particles and the like) onto the substrate and/or damages (corrosion) on the object to be washed.

Specific examples of the charge eliminating method include a method in which water and/or a treatment liquid is brought into contact with an electrically conductive material.

The contact time during which water and/or the treatment liquid is brought into contact with the electrically conductive material is preferably 0.001 to 1 second, and more preferably 0.01 to 0.1 seconds.

Specific examples of the resin include high-density polyethylene (HDPE), high-density polypropylene (PP), 6,6-nylon, polytetrafluoroethylene (PTFE), a tetrafluoroethylene/perfluoroalkylvinyl ether copolymer (PFA), polychlorotrifluoroethylene (PCTFE), an ethylene/chlorotrifluoroethylene copolymer (ECTFE), an ethylene/ethylene tetrafluoride copolymer (ETFE), and an ethylene tetrafluoride/propylene hexafluoride copolymer (FEP).

Examples of the electrically conductive material include stainless steel, gold, platinum, diamond, and glassy carbon.

The method for washing a substrate according to a first embodiment of the present invention is a method for washing a substrate, in which the method has a treatment liquid preparing step A, a washing step B, a drainage recovering step C in which drainage of the treatment liquid used in the washing step B is recovered, a washing step D in which a newly prepared substrate comprising a predetermined layer is washed with the recovered drainage of the treatment liquid, a drainage recovering step E in which drainage of the treatment liquid used in the washing step D is recovered, and repeats the washing step D and the drainage recovering step E to recycle drainage of the treatment liquid.

In the method for washing a substrate according to the embodiment, the aspects of the treatment liquid preparing step A and the washing step B are as described above. Also, in an aspect of reusing the drainage, it is preferable that the method has the coarse particle removing step H, and the charge eliminating steps I and J, described in the above-mentioned aspect. Further, the method may have the treatment liquid preparing step A described in the above-mentioned aspect before the washing step B.

An aspect of the washing step D in which the washing of the substrate is performed using the recovered drainage of the treatment liquid is as described above.

A drainage recovering means in the drainage recovering steps C and E is not particularly limited. The recovered drainage is preferably stored in the above-mentioned container in the charge eliminating step J, and the same charge eliminating step as the charge eliminating step J may be performed at this time. In addition, a step of subjecting the recovered drainage to filtering or the like to remove impurities may be provided.

EXAMPLES

Hereinbelow, the present invention will be described in more detail with reference to Examples. The materials, the amounts and proportions of materials to be used, the treatment details, the treatment procedure, or the like shown in Examples below may be modified as appropriate as long as the modifications do not depart from the spirit of the present invention. Therefore, the scope of the present invention should not be construed as being limited to Examples shown below.

[Preparation of Treatment Liquid]

The respective components described in the following tables were mixed in the blending formulations described in the following tables to prepare each of treatment liquids of Examples and Comparative Examples. In addition, in each of the treatment liquids, the contents (all based on mass) of various components are as described in the tables.

Here, as various components shown in the tables, the components classified into a semiconductor grade or the components classified into a high-purity grade equivalent thereto were used.

Various components shown in the tables are set forth below.

<Section of "Water">
Ultrapure water
<Section of "Organic Solvent">
EGBE: Ethylene glycol mono-n-butyl ether
EGME: Ethylene glycol monomethyl ether
DEGME: Diethylene glycol monomethyl ether
DEGBE: Diethylene glycol monobutyl ether
DMF: N,N-Dimethyl formamide
MMB: 3-Methoxy-3-methyl-1-butanol
DMSO: Dimethyl sulfoxide
PG: Propylene glycol
DEGEE: Diethylene glycol monoethyl ether
<Section of "Nitrogen-Containing Aromatic Heterocyclic Compound">
5MBTA: 5-Methyl-1H-benzotriazole (corresponding to the compound represented by General Formula (I))
BTA: Benzotriazole (corresponding to the compound represented by General Formula (I))
123 TZ: 1H-1,2,3 Triazole (corresponding to the compound represented by General Formula (I))
Compound A: Compound represented by the following structural formula (corresponding to the compound represented by General Formula (II))
Compound B: Compound represented by the following structural formula (corresponding to the compound represented by General Formula (III))
Compound C: Compound represented by the following structural formula (corresponding to the compound represented by General Formula (II))
Compound D: 1-Alkyl-substituted phenyltetrazole (tetrazole in which a phenyl group substituted with an alkyl group is substituted at the 1-position; corresponding to the compound represented by General Formula (V))
Compound E: 5-Alkyl substituted phenyltetrazole (tetrazole in which a phenyl group substituted with an alkyl group is substituted at the 5-position; corresponding to the compound represented by General Formula (V))
Compound X: Compound represented by the following structural formula (corresponding to the compound represented by General Formula (II))
Compound Y: Compound represented by the following structural formula (corresponding to the compound represented by General Formula (II))
Tetrazole: Tetrazole (corresponding to the compound represented by General Formula (IV))
5-Aminotetrazole: 5-Aminotetrazole (corresponding to the compound represented by General Formula (IV))

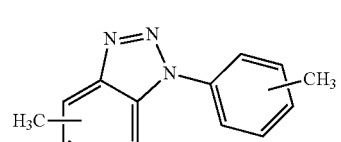

Compound A

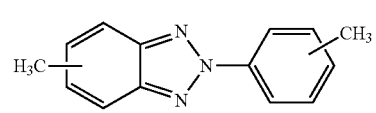

Compound B

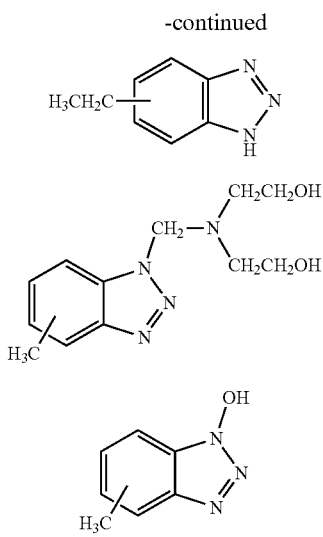

Compound C

Compound X

Compound Y

<Section of "Basic Compound">

DBU: 1,8-Diazabicyclo[5.4.0]-7-undecene (corresponding to the nitrogen-containing alicyclic compound)

εCAP: ε-Caprolactam (corresponding to the nitrogen-containing alicyclic compound)

Compound 1: Compound represented by the following structural formula (corresponding to the nitrogen-containing alicyclic compound)

Compound 2: Compound represented by the following structural formula (corresponding to the nitrogen-containing alicyclic compound)

Compound 3: Compound represented by the following structural formula (corresponding to the nitrogen-containing alicyclic compound)

NH$_4$OH: Ammonium hydroxide

DABCO: 1,4-Diazabicyclo[2.2.2]octane (corresponding to the nitrogen-containing alicyclic compound)

THFA: Tetrahydrofurfurylamine (corresponding to the nitrogen-containing alicyclic compound)

2AEPZ: N-(2-Aminoethyl)piperazine (corresponding to the nitrogen-containing alicyclic compound)

IE: 2,2'-Iminodiethanol

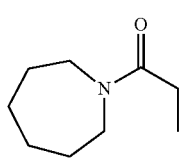

Compound 1

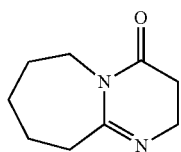

Compound 2

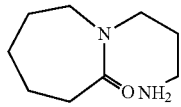

Compound 3

<Section of "Cobalt Ion Source">

CoOx: Cobalt oxide (x: 1 or 2)

Co(OH)x: Cobalt hydroxide (x: 2 or 3)

CoSO$_4$: Cobalt sulfate

<Section of "Additive "1>

DTPA: Diethylenetriamine pentaacetic acid (corresponding to the chelating agent)

HF: Hydrogen fluoride (corresponding to the fluorine-containing compound)

<Section of "Additive 2">

HA: hydroxylamine (NH$_2$—OH, corresponding to the hydroxylamines)

TMAH: Tetramethylammonium hydroxide (corresponding to the quaternary ammonium hydroxide)

<Section of "Additive 3">

TG: 1-Thioglycerol (corresponding to the anticorrosive agent)

[Various Quantifications]

Trace amounts of components were quantified by the following method.

<Content of Cobalt Ion>

Agilent 8800 triple quadrupole ICP-MS (for analyzing a semiconductor, option #200) was used for the measurement. The content of the cobalt ion was determined, based on the measurement results.

Measurement Conditions

In a sample introduction system, a quartz torch, a coaxial perfluoroalkoxyalkane (PFA) nebulizer, and a platinum interface cone were used. Measurement parameters for cool plasma conditions are as follows.

Radio frequency (RF) output (W): 600

Carrier gas flow rate (L/min): 0.7

Makeup gas flow (L/min): 1

Sampling depth (mm): 18

<Content of Nitrogen-Containing Aromatic Heterocyclic Compound (B)>

In the measurement, a gas chromatography mass spectrometer (trade name: "GCMS-2020", manufactured by Shimadzu Corporation, the measurement conditions are as follows) was used.

(Measurement Conditions)

Capillary column: InertCap 5MS/NP 0.25 mm I.D.×30 mdf=0.25 μm

Sample introduction method: Split 75 kPa pressure constant

Vaporization chamber temperature: 230° C.

Column oven temperature: 80° C. (2 min) to 500° C. (13 min), temperature raising rate of 15° C./min Carrier gas: Helium Septum purge flow rate: 5 mL/min Split ratio: 25:1

Interface temperature: 250° C.

Ion source temperature: 200° C.

Measurement mode: Scan m/z=85 to 500

Sample introduction amount: 1 μL

<Content of Nitrogen-Containing Alicyclic Compounds (Compound 1, Compound 2, and Compound 3)>

In the same manner as for the nitrogen-containing aromatic heterocyclic compound (B), a gas chromatography mass spectrometer (trade name: "GCMS-2020", manufactured by Shimadzu Corporation, the measurement conditions are as above) was used.

[Evaluation]

<Anticorrosion Properties>

(Evaluation of Anticorrosion Properties for Co Layer)

A film formed of Co (wiring model, hereinafter also referred to as a "Co film") was prepared, and the anticorrosion properties was evaluated, based on the etching rates of the film. The film thickness of the Co film is 1,000 Å. It can be considered that in a case where the etching rate is low, the anticorrosion properties are excellent, and in a case where the etching rate is high, the anticorrosion properties are deteriorated.

Using each of the treatment liquids of Examples and Comparative Examples, the Co film was subjected to an etching treatment. Specifically, the Co film was immersed in each of the treatment liquids of Examples and Comparative Examples for 10 minutes, and the etching rate (Å/min) was calculated, based on a difference in the film thickness of the Co film between before and after the immersion in the treatment liquid.

Moreover, the film thickness of the Co film before and after the treatment was measured using ellipsometry (spectroscopic ellipsometer, trade name "Vase", manufactured by J. A. Woollam Co.) under the conditions of a measuring range of 250 to 1,000 nm and measuring angles of 70 degrees and 75 degrees.

Furthermore, a film formed of Cu, a film formed of W, and a film formed of $SiO_2$ were prepared, and etching rates were calculated in the same manner as above.

In addition, the results were evaluated in accordance the following standard depending on the types of films, and the measurement results and evaluations are summarized in the tables.

(Evaluation Standard)

"A": 0.5 Å/min or less (the anticorrosion properties are particularly excellent)

"B": More than 0.5 Å/min and 1.0 Å/min or less (the anticorrosion properties are excellent)

"C": 1.0 Å/min and 2.0 Å/min or less (at practically usable levels)

"D": More than 2.0 Å/min and 3.0 Å/min or less (at unusable levels having problems in the anticorrosion properties)

"E": More than 3.0 Å/min (at unusable levels due to dissolution of the metal layer)

<Residue Removing Properties>

A laminate (corresponding to a laminate before the treatment) comprising a Co film, a SiN film, a $SiO_2$ film, and a metal hard mask (TiN) having a predetermined aperture in this order was formed on a substrate (Si). Using the obtained laminate, plasma etching was carried out with the metal hard mask as a mask, and etching of the SiN film and the $SiO_2$ film was performed until the surface of the Co film was exposed to form holes, thereby producing a sample 1 (see FIG. 1). As the cross-section of the laminate was confirmed with a scanning electron micrograph (SEM), plasma etching residues were observed on the wall surface of the holes.

In addition, the residue removing properties were evaluated according to the following procedure. First, a workpiece (about 2.0 cm×2.0 cm) of the sample 1 prepared above was immersed in each of the treatment liquids at a temperature controlled to 60° C., and the workpiece of the sample 1 was taken out after 10 minutes, and then immediately washed with ultrapure water and dried under $N_2$. Thereafter, the workpiece surface of the sample 1 after immersion was observed by SEM and the removing properties for the plasma etching residue ("Residue removing properties") were evaluated in accordance with the following evaluation standard.

"AA: The plasma etching residues were completely removed within 5 minutes.

"B": The plasma etching residues were completely removed at a time after longer than 5 minutes and before 8 minutes or shorter.

"C": The plasma etching residues were completely removed at a time after longer than 8 minutes and before 10 minutes or shorter.

"D": The plasma etching residues were not completely removed at a point of time after longer than 10 minutes, but there is no problem in the performance.

"E": The plasma etching residues were insufficiently removed at a point of time after longer than 10 minutes, and an influence on the performance is generated.

<Defect Suppressing Properties>

The number of foreign matters having a diameter of 32 nm or more present on the surface of the silicon substrate having a diameter of 300 mm and the address of each foreign matter were measured, using a wafer surface inspection device (SP-5, manufactured by KLA-Tencor Corporation).

Furthermore, a wafer for which the number of foreign matters present on the surface of the silicon substrate had been counted was set in a spinning wafer treatment device (manufactured by EKC Technology, Inc.).

Next, each of the treatment liquids of Examples and Comparative Examples was jetted onto the surface of the set wafer for 1 minute at a flow rate of 1.5 L/min. Thereafter, the wafer was spin-dried.

For the obtained wafer after drying, the number and the addresses of the foreign matters on the wafer were measured using the wafer surface inspection device.

The number of the obtained particles was evaluated in accordance with the following evaluation standard. The results are shown in the tables.

"A": The number of particles having diameters of 32 nm or more is 0 or more and less than 100.

"B": The number of particles having diameters of 32 nm or more is 100 or more and less than 500.

"C": The number of particles having diameters of 32 nm or more is 500 or more and less than 1,000.

"D": The number of particles having diameters of 32 nm or more is 1,000 or more.

The evaluation results are shown in the following tables.

<Resist Residue Peeling Test>

A sample 2 having a resist film formed on a Si substrate was obtained with reference to paragraph 0030 of JP2012-194536A. A workpiece (about 2.0 cm×2.0 cm) of the sample 2 was immersed in each of the treatment liquids at a temperature to 60° C., and the workpiece of the sample 2 was taken out after 10 minutes, and immediately washed with ultrapure water and dried under $N_2$. Thereafter, the workpiece surface of the sample 2 after immersion was observed with the naked eye and evaluated in accordance with the following evaluation standard. Further, in the tables, "-" indicates that the measurement was not carried out.

"A": The resist was completely removed within 2 minutes.

"B": More than 2 minutes were taken to completely remove the resist.

Moreover, in the following tables, the compositions of the treatment liquids (Examples 1 to 23) are shown in Table 1-1, and various compositional ratios and evaluation results of the treatment liquids shown in Table 1-1 are shown in Table 1-2.

The compositions of the treatment liquids (Examples 24 to 51) are shown in Table 2-1, and various compositional ratios and evaluation results of the treatment liquids shown in Table 2-1 are shown in Table 2-2.

The compositions of the treatment liquids (Examples 52 to 74) are shown in Table 3-1, and various compositional ratios and evaluation results of the treatment liquids shown in Table 3-1 are shown in Table 3-2.

The compositions of the treatment liquids (Examples 75 to 101) are shown in Table 4-1, and various compositional ratios and evaluation results of the treatment liquids shown in Table 4-1 are shown in Table 4-2.

The compositions of the treatment liquids (Examples 102 to 119) are shown in Table 5-1, and various compositional ratios and evaluation results of the treatment liquids shown in Table 5-1 are shown in Table 5-2.

The compositions of the treatment liquids (Comparative Examples 1 to 6) are shown in Table 6-1, and various compositional ratios and evaluation results of the treatment liquids shown in Table 6-1 are shown in Table 6-2.

That is, for example, by way of Example 1, the treatment liquid of Example 1 is formed of water (balance), the organic solvent (EGBE: 3.00% by mass), the nitrogen-containing aromatic heterocyclic compound (A) (5MBTA: 0.20% by mass), and the nitrogen-containing aromatic heterocyclic compound (B) (compound A: 8 ppm by mass), as shown in Table 1-1. Incidentally, in Example 1, the mass content ratio of the nitrogen-containing aromatic heterocyclic compound (A) to the nitrogen-containing aromatic heterocyclic compound (B) is 250, as shown in Table 1-2. In addition, the anticorrosion properties of the treatment liquid of Example 1 are as follows: the anticorrosion properties for Co are 0.7 Å/min (Evaluated as B), the anticorrosion properties for Cu are 0.8 Å/min (Evaluated as B), the anticorrosion properties for W are 1.2 Å/min (Evaluated as C), and the anticorrosion properties for $SiO_2$ are 0.6 Å/min (Evaluated as B). Furthermore, the residue removing properties and the defect suppressing properties of the treatment liquid of Example 1 were evaluated as C and B, respectively.

In addition, for example, a citation such as "1.E+01" means the $1^{st}$ power of $1.0\times10$. That is, "2.E×05" means the $5^{th}$ power of $2.0\times10$.

TABLE 1-1

| | Water Content (% by mass) | Organic solvent | | Nitrogen-containing aromatic heterocyclic compound | | | | | Basic compound Nitrogen-containing alicyclic-compound | |
|---|---|---|---|---|---|---|---|---|---|---|
| | | | | (A) | | (B) | | (B)' | | |
| | | Name of compound | Content (% by mass) | Name of compound | Content (% by mass) | Name of compound | Content (% by mass) | Name of compound | Content (% by mass) | Name of compound | Content (% by mass) |
| Example 1 | Balance | EGBE | 3.00% | 5MBTA | 0.20% | Compound A | 8 | | | — | — |
| Example 2 | Balance | EGBE | 3.00% | 5MBTA | 0.20% | Compound A | 8 | | | DBU | 0.76% |
| Example 3 | Balance | EGBE | 3.00% | 5MBTA | 0.20% | Compound A | 8 | | | DBU | 0.76% |
| Example 4 | Balance | EGBE | 3.00% | 5MBTA | 0.20% | Compound A | 8 | | | DBU | 0.76% |
| Example 5 | Balance | EGBE | 3.00% | 5MBTA | 0.20% | Compound A | 8 | | | — | — |
| Example 6 | Balance | EGBE | 3.00% | 5MBTA | 0.20% | Compound A | 8 | | | — | — |
| Example 7 | Balance | EGBE | 3.00% | 5MBTA | 0.20% | Compound A | 8 | | | — | — |
| Example 8 | Balance | EGBE | 3.00% | 5MBTA | 0.20% | Compound A | 8 | | | — | — |
| Example 9 | Balance | EGBE | 3.00% | 5MBTA | 0.20% | Compound A | 8 | | | — | — |
| Example 10 | Balance | EGBE | 3.00% | 5MBTA | 0.20% | Compound A | 8 | | | — | — |
| Example 11 | Balance | EGBE | 3.00% | 5MBTA | 0.20% | Compound A | 8 | | | DBU | 0.76% |
| Example 12 | Balance | EGBE | 3.00% | 5MBTA | 0.20% | Compound A | 8 | | | DBU | 0.76% |
| Example 13 | Balance | EGBE | 3.00% | 5MBTA | 0.20% | Compound A | 8 | | | DBU | 0.76% |
| Example 14 | Balance | EGBE | 3.00% | 5MBTA | 0.20% | Compound A | 8 | | | DBU | 0.76% |
| Example 15 | Balance | EGBE | 3.00% | 5MBTA | 0.20% | Compound B | 8 | | | DBU | 0.76% |
| Example 16 | Balance | EGBE | 3.00% | 5MBTA | 0.20% | Compound C | 8 | | | DBU | 0.76% |
| Example 17 | Balance | EGBE | 3.00% | BTA | 0.20% | Compound A | 8 | | | DBU | 0.76% |
| Example 18 | Balance | EGBE | 3.00% | 123TZ | 0.20% | Compound A | 8 | | | DBU | 0.76% |
| Example 19 | Balance | EGBE | 3.00% | 5MBTA | 0.20% | Compound A | 1000 | | | DBU | 0.76% |
| Example 20 | Balance | EGBE | 3.00% | 5MBTA | 0.20% | Compound A | 100 | | | DBU | 0.76% |
| Example 21 | Balance | EGBE | 3.00% | 5MBTA | 0.20% | Compound A | 15 | | | DBU | 0.76% |
| Example 22 | Balance | EGBE | 3.00% | 5MBTA | 0.20% | Compound A | 1 | | | DBU | 0.76% |
| Example 23 | Balance | EGBE | 3.00% | 5MBTA | 0.20% | Compound A | 0.1 | | | DBU | 0.76% |

| | Basic compound | | | | Co ion | | Other additives | | | | | |
|---|---|---|---|---|---|---|---|---|---|---|---|---|
| | Ammonium hydroxide | | Secondary amine | | | | Additive 1 | | Additive 2 | | Additive 3 | |
| | Name of compound | Content (% by mass) | Name of compound | Content (% by mass) | Type of Co ion source | Content (ppt by mass) of Co ion | Name of compound | Content (% by mass) | Name of compound | Content (% by mass) | Name of compound | Content (% by mass) |
| Example 1 | — | — | — | — | — | — | — | — | — | — | — | — |
| Example 2 | — | — | — | — | — | — | — | — | — | — | — | — |
| Example 3 | — | — | — | — | — | — | DTPA | 0.60% | — | — | — | — |
| Example 4 | — | — | — | — | — | — | DTPA | 0.60% | HA | 5.00% | — | — |
| Example 5 | — | — | — | — | CoOx | 50.0 | — | — | — | — | — | — |
| Example 6 | — | — | — | — | CoOx | 250.0 | — | — | — | — | — | — |
| Example 7 | — | — | — | — | CoOx | 750.0 | — | — | — | — | — | — |
| Example 8 | — | — | — | — | CoOx | 2,500.0 | — | — | — | — | — | — |
| Example 9 | — | — | — | — | Co(OH)x | 750.0 | — | — | — | — | — | — |
| Example 10 | — | — | — | — | $CoSO_4$ | 750.0 | — | — | — | — | — | — |
| Example 11 | — | — | — | — | CoOx | 2,500.0 | — | — | — | — | — | — |

TABLE 1-1-continued

| | | | | | | | | | | | |
|---|---|---|---|---|---|---|---|---|---|---|---|
| Example 12 | — | — | — | — | CoOx | 1,500.0 | — | — | — | — | — |
| Example 13 | — | — | — | — | CoOx | 250.0 | — | — | — | — | — |
| Example 14 | — | — | — | — | CoOx | 50.0 | — | — | — | — | — |
| Example 15 | — | — | — | — | — | — | DTPA | 0.60% | HA | 5.00% | — | — |
| Example 16 | — | — | — | — | — | — | DTPA | 0.60% | HA | 5.00% | — | — |
| Example 17 | — | — | — | — | — | — | DTPA | 0.60% | HA | 5.00% | — | — |
| Example 18 | — | — | — | — | — | — | DTPA | 0.60% | HA | 5.00% | — | — |
| Example 19 | — | — | — | — | — | — | DTPA | 0.60% | HA | 5.00% | — | — |
| Example 20 | — | — | — | — | — | — | DTPA | 0.60% | HA | 5.00% | — | — |
| Example 21 | — | — | — | — | — | — | DTPA | 0.60% | HA | 5.00% | — | — |
| Example 22 | — | — | — | — | — | — | DTPA | 0.60% | HA | 5.00% | — | — |
| Example 23 | — | — | — | — | — | — | DTPA | 0.60% | HA | 5.00% | — | — |

TABLE 1-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | $SiO_2$ | | | | |
| | | | | | Measured value Å/min | Evaluation | Measured value Å/min | Evaluation | Measured value Å/min | Evaluation | Measured value Å/min | Evaluation | | | |
| Example 1 | 250 | — | — | — | 0.7 | B | 0.8 | B | 1.2 | C | 0.6 | B | C | B | — |
| Example 2 | 250 | — | — | — | 0.9 | B | 0.9 | B | 0.8 | B | 0.6 | B | B | B | — |
| Example 3 | 250 | — | — | — | 1.7 | C | 1.3 | C | 1.7 | C | 0.3 | A | B | B | — |
| Example 4 | 250 | — | — | — | 0.1 | A | 0.2 | A | 0.1 | A | 0.4 | A | A | A | A |
| Example 5 | 250 | 2.E+05 | — | — | 0.5 | B | 0.6 | B | 0.7 | B | 0.3 | A | A | A | — |
| Example 6 | 250 | 3.E+04 | — | — | 0.3 | A | 0.3 | A | 0.2 | A | 0.3 | A | A | A | — |
| Example 7 | 250 | 1.E+04 | — | — | 0.1 | A | 0.1 | A | 0.1 | A | 0.1 | A | A | A | — |
| Example 8 | 250 | 3.E+03 | — | — | 0.1 | A | 0.2 | A | 0.1 | A | 0.1 | A | B | B | — |
| Example 9 | 250 | 1.E+04 | — | — | 0.1 | A | 0.1 | A | 0.1 | A | 0.1 | A | A | A | — |
| Example 10 | 250 | 1.E+04 | — | — | 0.1 | A | 0.2 | A | 0.1 | A | 0.1 | A | A | A | — |
| Example 11 | 250 | 3.E+03 | 3.E+06 | — | 0.1 | A | 0.2 | A | 0.2 | A | 0.2 | A | B | B | — |
| Example 12 | 250 | 5.E+03 | 5.E+06 | — | 0.3 | A | 0.3 | A | 0.3 | A | 0.3 | A | B | B | — |
| Example 13 | 250 | 3.E+04 | 3.E+07 | — | 0.3 | A | 0.2 | A | 0.4 | B | 0.3 | A | A | A | — |
| Example 14 | 250 | 2.E+05 | 2.E+08 | — | 0.4 | B | 0.5 | B | 0.5 | B | 0.4 | B | A | A | — |
| Example 15 | 250 | — | — | — | 0.3 | A | 0.2 | A | 0.7 | A | 0.4 | A | A | A | — |
| Example 16 | 250 | — | — | — | 0.8 | B | 0.6 | B | 0.6 | A | 0.4 | A | A | A | — |
| Example 17 | 250 | — | — | — | 1.4 | C | 1.2 | C | 1.1 | C | 0.4 | A | A | B | — |
| Example 18 | 250 | — | — | — | 1.4 | C | 1.3 | C | 1.4 | C | 0.6 | B | A | A | — |
| Example 19 | 2 | — | — | — | 0.1 | A | 0.1 | A | 0.1 | A | 0.2 | A | B | B | — |
| Example 20 | 20 | — | — | — | 0.1 | A | 0.2 | A | 0.1 | A | 0.1 | A | B | B | — |
| Example 21 | 133 | — | — | — | 0.1 | A | 0.1 | A | 0.1 | A | 0.1 | A | A | A | — |
| Example 22 | 2,000 | — | — | — | 0.3 | A | 0.2 | A | 0.1 | A | 0.1 | A | A | A | — |
| Example 23 | 20,000 | — | — | — | 0.4 | B | 0.3 | A | 0.1 | A | 0.2 | A | A | A | — |

TABLE 2-1

| | | Organic solvent | | Nitrogen-containing aromatic heterocyclic compound | | | | | | Basic compound Nitrogen-containing alicyclic-compound | |
|---|---|---|---|---|---|---|---|---|---|---|---|
| | | | | (A) | | (B) | | (B)' | | | |
| | Water Content (% by mass) | Name of compound | Content (% by mass) | Name of compound | Content (% by mass) | Name of compound | Content (% by mass) | Name of compound | Content (% by mass) | Name of compound | Content (% by mass) |
| Example 24 | Balance | EGBE | 3.00% | 5MBTA | 0.20% | Compound A | 8 | | | DBU/εCAP (mass ratio: 1/0.001) | 0.76% |
| Example 25 | Balance | EGBE | 3.00% | 5MBTA | 0.20% | Compound A | 8 | | | DBU/compound 1 (mass ratio: 1/0.001) | 0.76% |
| Example 26 | Balance | EGBE | 3.00% | 5MBTA | 0.20% | Compound A | 8 | | | DBU/compound 2 (mass ratio: 1/0.001) | 0.76% |
| Example 27 | Balance | EGBE | 3.00% | 5MBTA | 0.20% | Compound A | 8 | | | DBU/compound 3 (mass ratio: 1/0.001) | 0.76% |
| Example 28 | Balance | DMF | 69.00% | 5MBTA | 0.20% | Compound A | 8 | | | — | — |
| Example 29 | Balance | EGME | 69.00% | 5MBTA | 0.20% | Compound A | 8 | | | — | — |
| Example 30 | Balance | DEGME | 69.00% | 5MBTA | 0.20% | Compound A | 8 | | | — | — |
| Example 31 | Balance | DEGBE | 69.00% | 5MBTA | 0.20% | Compound A | 8 | | | — | — |
| Example 32 | Balance | DEGBE | 69.00% | 5MBTA | 0.20% | Compound A | 8 | | | — | — |
| Example 33 | Balance | DEGBE | 69.00% | 5MBTA | 0.20% | Compound A | 8 | | | — | — |
| Example 34 | Balance | DEGBE | 69.00% | 5MBTA | 0.20% | Compound A | 8 | | | — | — |
| Example 35 | Balance | DEGBE | 69.00% | 5MBTA | 0.20% | Compound A | 8 | | | — | — |
| Example 36 | Balance | MMB | 15.00% | 5MBTA | 0.20% | Compound A | 8 | | | THFA | 3.00% |
| Example 37 | Balance | MMB | 15.00% | 5MBTA | 0.20% | Compound A | 8 | | | 2AEPZ | 3.00% |
| Example 38 | Balance | MMB | 15.00% | 5MBTA | 0.20% | Compound A | 8 | | | DBU | 3.00% |
| Example 39 | Balance | MMB | 15.00% | 5MBTA | 0.20% | Compound A | 8 | | | DABCO | 3.00% |
| Example 40 | Balance | MMB | 15.00% | 5MBTA | 0.20% | Compound A | 8 | | | | |
| Example 41 | Balance | DEGBE/DMSO (mass ratio: 1/1) | 80.00% | 5MBTA | 0.20% | Compound A | 8 | | | DBU | 0.10% |
| Example 42 | Balance | DEGBE/DMSO (mass ratio: 1/1) | 80.00% | 5MBTA | 0.20% | Compound A | 8 | | | DBU | 0.10% |
| Example 43 | Balance | DMSO/PG/DEGBE (mass ratio: 3/2/2) | 68.00% | BTA | 0.20% | Compound X | 10 | | | THFA | 3.00% |
| Example 44 | Balance | DEGEE | 46.00% | BTA | 0.20% | Compound X | 10 | | | THFA | 3.00% |
| Example 45 | Balance | DEGEE | 46.00% | 5MBTA | 0.20% | Compound A | 10 | | | THFA | 3.00% |
| Example 46 | Balance | DEGEE | 46.00% | 5MBTA | 0.20% | Compound B | 15 | | | THFA | 3.00% |
| Example 47 | Balance | DEGEE | 46.00% | 5MBTA | 0.20% | Compound C | 41 | | | THFA | 3.00% |
| Example 48 | Balance | DEGEE | 46.00% | 5MBTA | 0.20% | Compound A | 10 | | | 2AEPZ | 3.00% |
| Example 50 | Balance | DEGEE | 46.00% | 5MBTA | 0.20% | Compound A | 10 | | | DBU | 3.00% |
| Example 51 | Balance | DEGEE | 46.00% | 5MBTA | 0.20% | Compound A | 10 | | | DABCO | 3.00% |

| | Basic compound | | | | Co ion | | Other additives | | | | | |
|---|---|---|---|---|---|---|---|---|---|---|---|---|
| | Ammonium hydroxide | | Secondary amine | | | Content | Additive 1 | | Additive 2 | | Additive 3 | |
| | Name of compound | Content (% by mass) | Name of compound | Content (% by mass) | Type of Co ion source | (ppt by mass) of Co ion | Name of compound | Content (% by mass) | Name of compound | Content (% by mass) | Name of compound | Content (% by mass) |
| Example 24 | — | — | — | — | — | — | DTPA | 0.60% | — | — | — | — |
| Example 25 | — | — | — | — | — | — | DTPA | 0.60% | — | — | — | — |
| Example 26 | — | — | — | — | — | — | DTPA | 0.60% | — | — | — | — |

TABLE 2-1-continued

| | | | | | | | | | | | |
|---|---|---|---|---|---|---|---|---|---|---|---|
| Example 27 | — | — | — | — | — | — | DTPA | 0.60% | — | — | — |
| Example 28 | NH₄OH | 0.70% | — | — | — | — | HF | 0.40% | — | — | — |
| Example 29 | NH₄OH | 0.70% | — | — | — | — | HF | 0.40% | — | — | — |
| Example 30 | NH₄OH | 0.70% | — | — | — | — | HF | 0.40% | — | — | — |
| Example 31 | NH₄OH | 0.70% | — | — | — | — | HF | 0.40% | — | — | — |
| Example 32 | — | — | — | — | CoOx | 750.0 | HF | 0.40% | — | — | — |
| Example 33 | — | — | — | — | CoOx | 1500.0 | HF | 0.40% | — | — | — |
| Example 34 | — | — | — | — | CoOx | 250.0 | HF | 0.40% | — | — | — |
| Example 35 | — | — | — | — | CoOx | 50.0 | HF | 0.40% | — | — | — |
| Example 36 | — | — | — | — | — | — | — | — | — | — | — |
| Example 37 | — | — | — | — | — | — | — | — | — | — | — |
| Example 38 | — | — | — | — | — | — | — | — | — | — | — |
| Example 39 | — | — | — | — | — | — | — | — | — | — | — |
| Example 40 | — | — | — | — | CoOx | 750.0 | — | — | TMAH | 0.70% | — |
| Example 41 | — | — | — | — | — | — | — | — | — | — | — |
| Example 42 | — | — | — | — | — | — | DTPA | 0.30% | — | — | — |
| Example 43 | — | — | — | — | — | — | — | — | TMAH | 10.0% | TG 5.00% |
| Example 44 | — | — | — | — | — | — | — | — | TMAH | 10.0% | TG 5.00% |
| Example 45 | — | — | — | — | — | — | — | — | TMAH | 10.0% | TG 5.00% |
| Example 46 | — | — | — | — | — | — | — | — | TMAH | 10.0% | TG 5.00% |
| Example 47 | — | — | — | — | — | — | — | — | TMAM | 10.0% | TG 5.00% |
| Example 48 | — | — | — | — | — | — | — | — | TMAH | 10.0% | TG 5.00% |
| Example 50 | — | — | — | — | — | — | — | — | TMAH | 10.0% | TG 5.00% |
| Example 51 | — | — | — | — | — | — | — | — | TMAH | 10.0% | TG 5.00% |

TABLE 2-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties Co Measured value Å/min | Evaluation | Cu Measured value Å/min | Evaluation | W Measured value Å/min | Evaluation | $SiO_2$ Measured value Å/min | Evaluation | Residue removing properties | Defect suppressing properties | Resist residue peeling properties |
|---|---|---|---|---|---|---|---|---|---|---|---|---|---|---|---|
| Example 24 | 250 | — | — | — | 0.8 | B | 0.6 | B | 1.7 | C | 0.3 | A | A | A | — |
| Example 25 | 250 | — | — | — | 0.9 | B | 0.7 | B | 0.8 | B | 0.2 | A | A | A | — |
| Example 26 | 250 | — | — | — | 0.9 | B | 0.8 | B | 1.1 | C | 0.2 | A | A | A | — |
| Example 27 | 250 | — | — | — | 0.3 | A | 0.2 | A | 0.8 | B | 0.2 | A | A | A | — |
| Example 28 | 250 | — | — | — | 1.3 | C | 1.1 | C | 1.2 | C | 1.2 | C | C | C | — |
| Example 29 | 250 | — | — | — | 1.3 | C | 1.4 | C | 0.8 | B | 1.2 | C | B | B | — |
| Example 30 | 250 | — | — | — | 0.9 | B | 0.7 | B | 0.8 | B | 0.8 | B | B | B | — |
| Example 31 | 250 | — | — | — | 0.3 | A | 0.6 | B | 0.2 | A | 0.3 | B | A | B | — |
| Example 32 | 250 | 1.E+04 | — | 5.E+06 | 0.3 | A | 0.2 | A | 0.2 | A | 0.3 | A | A | B | A |
| Example 33 | 250 | 5.E+03 | — | 3.E+06 | 0.3 | A | 0.1 | A | 0.2 | A | 0.3 | A | B | B | — |
| Example 34 | 250 | 3.E+04 | — | 2.E+07 | 0.3 | A | 0.2 | A | 0.2 | A | 0.3 | A | A | B | — |
| Example 35 | 250 | 2.E+05 | — | 8.E+07 | 0.3 | A | 0.1 | A | 0.2 | A | 0.3 | A | B | B | — |
| Example 36 | 250 | — | — | — | 0.4 | A | 0.2 | A | 0.8 | B | 0.3 | A | B | B | — |
| Example 37 | 250 | — | — | — | 0.8 | B | 0.7 | B | 0.6 | B | 0.3 | A | B | B | — |
| Example 38 | 250 | — | — | — | 0.2 | A | 0.1 | A | 0.7 | B | 0.1 | A | A | A | — |
| Example 39 | 250 | — | — | — | 0.3 | A | 0.1 | A | 0.9 | B | 0.2 | A | B | B | — |
| Example 40 | 250 | 1.E+04 | — | — | 0.4 | A | 0.2 | A | 0.4 | A | 0.3 | A | A | A | — |
| Example 41 | 250 | — | — | — | 0.8 | B | 0.7 | B | 0.6 | B | 0.3 | A | B | B | — |
| Example 42 | 250 | — | — | — | 1.2 | C | 1.4 | C | 0.7 | B | 0.3 | A | A | A | — |
| Example 43 | 200 | — | — | — | 0.3 | A | 0.2 | A | 0.3 | A | 0.3 | A | B | A | — |
| Example 44 | 200 | — | — | — | 0.3 | A | 0.1 | A | 0.4 | A | 0.3 | A | A | A | A |
| Example 45 | 200 | — | — | — | 0.2 | A | 0.1 | A | 0.2 | A | 0.3 | A | A | A | — |
| Example 46 | 133 | — | — | — | 0.2 | A | 0.2 | A | 0.8 | B | 0.3 | A | A | B | — |
| Example 47 | 49 | — | — | — | 0.6 | B | 0.8 | B | 0.4 | A | 0.3 | A | B | B | — |
| Example 48 | 200 | — | — | — | 0.4 | A | 0.2 | A | 0.3 | A | 0.3 | A | B | A | — |

TABLE 2-2-continued

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | SiO₂ | | | | |
| | | | | | Measured value Å/min | Evaluation | Measured value Å/min | Evaluation | Measured value Å/min | Evaluation | Measured value Å/min | Evaluation | | | |
| Example 50 | 200 | — | — | — | 0.2 | A | 0.1 | A | 0.3 | A | 0.3 | A | A | A | — |
| Example 51 | 200 | — | — | — | 0.3 | A | 0.2 | A | 0.9 | B | 0.4 | A | B | B | — |

TABLE 3-1

| | Organic solvent | | | Nitrogen-containing aromatic heterocyclic compound | | | | | | Basic compound | |
|---|---|---|---|---|---|---|---|---|---|---|---|
| | | | | (A) | | (B) | | (B)' | | Nitrogen-containing alicyclic-compound | |
| | Water Content (% by mass) | Name of compound | Content (% by mass) | Name of compound | Content (% by mass) | Name of compound | Content (% by mass) | Name of compound | Content (% by mass) | Name of compound | Content (% by mass) |
| Example 52 | Balance | EGBE | 3.00% | Tetrazole | 0.20% | Compound D | 8 | | | — | — |
| Example 53 | Balance | EGBE | 3.00% | Tetrazole | 0.20% | Compound D | 8 | | | DBU | 0.76% |
| Example 54 | Balance | EGBE | 3.00% | Tetrazole | 0.20% | Compound D | 8 | | | DBU | 0.76% |
| Example 55 | Balance | EGBE | 3.00% | Tetrazole | 0.20% | Compound D | 8 | | | DBU | 0.76% |
| Example 56 | Balance | EGBE | 3.00% | Tetrazole | 0.20% | Compound D | 8 | | | — | — |
| Example 57 | Balance | EGBE | 3.00% | Tetrazole | 0.20% | Compound D | 8 | | | — | — |
| Example 58 | Balance | EGBE | 3.00% | Tetrazole | 0.20% | Compound D | 8 | | | — | — |
| Example 59 | Balance | EGBE | 3.00% | Tetrazole | 0.20% | Compound D | 8 | | | — | — |
| Example 60 | Balance | EGBE | 3.00% | Tetrazole | 0.20% | Compound D | 8 | | | — | — |
| Example 61 | Balance | EGBE | 3.00% | Tetrazole | 0.20% | Compound D | 8 | | | — | — |
| Example 62 | Balance | EGBE | 3.00% | Tetrazole | 0.20% | Compound D | 8 | | | DBU | 0.76% |
| Example 63 | Balance | EGBE | 3.00% | Tetrazole | 0.20% | Compound D | 8 | | | DBU | 0.76% |
| Example 64 | Balance | EGBE | 3.00% | Tetrazole | 0.20% | Compound D | 8 | | | DBU | 0.76% |
| Example 65 | Balance | EGBE | 3.00% | Tetrazole | 0.20% | Compound D | 8 | | | DBU | 0.76% |
| Example 66 | Balance | EGBE | 3.00% | Tetrazole | 0.20% | Compound D | 8 | | | DBU | 0.76% |
| Example 67 | Balance | EGBE | 3.00% | Tetrazole | 0.20% | Compound E | 8 | | | DBU | 0.76% |
| Example 68 | Balance | EGBE | 3.00% | Tetrazole | 0.20% | Compound D | 8 | | | DBU | 0.76% |
| Example 69 | Balance | EGBE | 3.00% | 5-amino Tetrazole | 0.20% | Compound D | 8 | | | DBU | 0.76% |
| Example 70 | Balance | EGBE | 3.00% | Tetrazole | 0.20% | Compound D | 1000 | | | DBU | 0.76% |
| Example 71 | Balance | EGBE | 3.00% | Tetrazole | 0.20% | Compound D | 100 | | | DBU | 0.76% |
| Example 72 | Balance | EGBE | 3.00% | Tetrazole | 0.20% | Compound D | 15 | | | DBU | 0.76% |
| Example 73 | Balance | EGBE | 3.00% | Tetrazole | 0.20% | Compound D | 1 | | | DBU | 0.76% |
| Example 74 | Balance | EGBE | 3.00% | Tetrazole | 0.20% | Compound D | 0.1 | | | DBU | 0.76% |

TABLE 3-1-continued

| | Basic compound | | | | Co ion | | Other additives | | | | | |
|---|---|---|---|---|---|---|---|---|---|---|---|---|
| | Ammonium hydroxide | | Secondary amine | | | Content | Additive 1 | | Additive 2 | | Additive 3 | |
| | Name of compound | Content (% by mass) | Name of compound | Content (% by mass) | Type of Co ion source | (ppt by mass) of Co ion | Name of compound | Content (% by mass) | Name of compound | Content (% by mass) | Name of compound | Content (% by mass) |
| Example 52 | — | — | — | — | — | — | — | — | — | — | — | — |
| Example 53 | — | — | — | — | — | — | — | — | — | — | — | — |
| Example 54 | — | — | — | — | — | — | DTPA | 0.60% | — | — | — | — |
| Example 55 | — | — | — | — | — | — | DTPA | 0.60% | HA | 5.00% | — | — |
| Example 56 | — | — | — | — | CoOx | 50.0 | — | — | — | — | — | — |
| Example 57 | — | — | — | — | CoOx | 250.0 | — | — | — | — | — | — |
| Example 58 | — | — | — | — | CoOx | 750.0 | — | — | — | — | — | — |
| Example 59 | — | — | — | — | CoOx | 2500.0 | — | — | — | — | — | — |
| Example 60 | — | — | — | — | Co(OH)x | 750.0 | — | — | — | — | — | — |
| Example 61 | — | — | — | — | $CoSO_4$ | 750.0 | — | — | — | — | — | — |
| Example 62 | — | — | — | — | CoOx | 2500.0 | — | — | — | — | — | — |
| Example 63 | — | — | — | — | CoOx | 1500.0 | — | — | — | — | — | — |
| Example 64 | — | — | — | — | CoOx | 250.0 | — | — | — | — | — | — |
| Example 65 | — | — | — | — | CoOx | 50.0 | — | — | — | — | — | — |
| Example 66 | — | — | — | — | — | — | DTPA | 0.60% | HA | 5.00% | — | — |
| Example 67 | — | — | — | — | — | — | DTPA | 0.60% | HA | 5.00% | — | — |
| Example 68 | — | — | — | — | — | — | DTPA | 0.60% | HA | 5.00% | — | — |
| Example 69 | — | — | — | — | — | — | DTPA | 0.60% | HA | 5.00% | — | — |
| Example 70 | — | — | — | — | — | — | DTPA | 0.60% | HA | 5.00% | — | — |
| Example 71 | — | — | — | — | — | — | DTPA | 0.60% | HA | 5.00% | — | — |
| Example 72 | — | — | — | — | — | — | DTPA | 0.60% | HA | 5.00% | — | — |
| Example 73 | — | — | — | — | — | — | DTPA | 0.60% | HA | 5.00% | — | — |
| Example 74 | — | — | — | — | — | — | DTPA | 0.60% | HA | 5.00% | — | — |

TABLE 3-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | $SiO_2$ | | | | |
| | | | | | Measured value Å/min | Evaluation | Measured value Å/min | Evaluation | Measured value Å/min | Evaluation | Measured value Å/min | Evaluation | | | |
| Example 52 | 250 | — | — | — | 0.7 | B | 0.8 | B | 1.2 | C | 0.6 | B | C | B | — |
| Example 53 | 250 | — | — | — | 0.9 | B | 0.9 | B | 0.8 | B | 0.6 | B | B | B | — |
| Example 54 | 250 | — | — | — | 1.7 | C | 1.3 | C | 1.7 | C | 0.3 | A | B | B | — |
| Example 55 | 250 | — | — | — | 0.1 | A | 0.2 | A | 0.1 | A | 0.4 | A | A | A | A |
| Example 56 | 250 | 2.E+05 | — | — | 0.5 | B | 0.6 | B | 0.7 | B | 0.3 | A | A | A | — |
| Example 57 | 250 | 3.E+04 | — | — | 0.3 | A | 0.3 | A | 0.2 | A | 0.3 | A | A | A | — |
| Example 58 | 250 | 1.E+04 | — | — | 0.1 | A | 0.1 | A | 0.1 | A | 0.1 | A | A | A | — |
| Example 59 | 250 | 3.E+03 | — | — | 0.1 | A | 0.2 | A | 0.1 | A | 0.1 | A | B | B | — |
| Example 60 | 250 | 1.E+04 | — | — | 0.1 | A | 0.1 | A | 0.1 | A | 0.1 | A | A | A | — |
| Example 61 | 250 | 1.E+04 | — | — | 0.1 | A | 0.2 | A | 0.1 | A | 0.1 | A | A | A | — |
| Example 62 | 250 | 3.E+03 | 3.E+06 | — | 0.1 | A | 0.2 | A | 0.2 | A | 0.2 | A | B | B | — |
| Example 63 | 250 | 5.E+03 | 5.E+06 | — | 0.3 | A | 0.3 | A | 0.3 | A | 0.3 | A | B | B | — |
| Example 64 | 250 | 3.E+04 | 3.E+07 | — | 0.3 | A | 0.2 | A | 0.4 | B | 0.3 | A | A | A | — |
| Example 65 | 250 | 2.E+05 | 2.E+08 | — | 0.4 | B | 0.5 | B | 0.5 | B | 0.4 | B | A | A | — |
| Example 66 | 250 | — | — | — | 0.3 | A | 0.2 | A | 0.7 | A | 0.4 | A | A | A | — |

TABLE 3-2-continued

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | SiO₂ | | | | |
| | | | | | Measured value Å/min | Evaluation | Measured value Å/min | Evaluation | Measured value Å/min | Evaluation | Measured value Å/min | Evaluation | | | |
| Example 67 | 250 | — | — | — | 0.8 | B | 0.6 | B | 0.6 | A | 0.4 | A | A | A | — |
| Example 68 | 250 | — | — | — | 1.4 | C | 1.2 | C | 1.1 | C | 0.4 | A | A | B | — |
| Example 69 | 250 | — | — | — | 1.4 | C | 1.3 | C | 1.4 | C | 0.6 | B | A | A | — |
| Example 70 | 2 | — | — | — | 0.1 | A | 0.1 | A | 0.1 | A | 0.2 | A | B | B | — |
| Example 71 | 20 | — | — | — | 0.1 | A | 0.2 | A | 0.1 | A | 0.1 | A | B | B | — |
| Example 72 | 133 | — | — | — | 0.1 | A | 0.1 | A | 0.1 | A | 0.1 | A | A | A | — |
| Example 73 | 2,000 | — | — | — | 0.3 | A | 0.2 | A | 0.1 | A | 0.1 | A | A | A | — |
| Example 74 | 20,000 | — | — | — | 0.4 | B | 0.3 | A | 0.1 | A | 0.2 | A | A | A | — |

TABLE 4-1

| | Organic solvent | | | Nitrogen-containing aromatic heterocyclic compound | | | | | | Basic compound | |
|---|---|---|---|---|---|---|---|---|---|---|---|
| | | | | (A) | | (B) | | | (B)' | Nitrogen-containing alicyclic-compound | |
| | Water Content (% by mass) | Name of compound | Content (% by mass) | Name of compound | Content (% by mass) | Name of compound | Content (% by mass) | Name of compound | Content (% by mass) | Name of compound | Content (% by mass) |
| Example 75 | Balance | EGBE | 3.00% | Tetrazole | 0.20% | Compound D | 8 | | | DBU/εCAP ratio: (mass 1/0.001) | 0.76% |
| Example 76 | Balance | EGBE | 3.00% | Tetrazole | 0.20% | Compound D | 8 | | | DBU/Compound 1 (mass ratio: 1/0.001) | 0.76% |
| Example 77 | Balance | EGBE | 3.00% | Tetrazole | 0.20% | Compound D | 8 | | | DBU/Compound 2 (mass ratio: 1/0.001) | 0.76% |
| Example 78 | Balance | EGBE | 3.00% | Tetrazole | 0.20% | Compound D | 8 | | | DBU/Compound 3 (mass ratio: 1/0.001) | 0.76% |
| Example 79 | Balance | DMF | 69.00% | Tetrazole | 0.20% | Compound D | 8 | | | — | — |
| Example 80 | Balance | EGME | 69.00% | Tetrazole | 0.20% | Compound D | 8 | | | — | — |
| Example 81 | Balance | DEGME | 69.00% | Tetrazole | 0.20% | Compound D | 8 | | | — | — |
| Example 82 | Balance | DEGBE | 69.00% | Tetrazole | 0.20% | Compound D | 8 | | | — | — |
| Example 83 | Balance | DEGBE | 69.00% | Tetrazole | 0.20% | Compound D | 8 | | | — | — |
| Example 84 | Balance | DEGBE | 69.00% | Tetrazole | 0.20% | Compound D | 8 | | | — | — |
| Example 85 | Balance | DEGBE | 69.00% | Tetrazole | 0.20% | Compound D | 8 | | | — | — |
| Example 86 | Balance | DEGBE | 69.00% | Tetrazole | 0.20% | Compound D | 8 | | | — | — |
| Example 87 | Balance | MMB | 15.00% | Tetrazole | 0.20% | Compound D | 8 | | | THFA | 3.00% |
| Example 88 | Balance | MMB | 15.00% | Tetrazole | 0.20% | Compound D | 8 | | | 2AEPZ | 3.00% |
| Example 89 | Balance | MMB | 15.00% | Tetrazole | 0.20% | Compound D | 8 | | | DBU | 3.00% |
| Example 90 | Balance | MMB | 15.00% | Tetrazole | 0.20% | Compound D | 8 | | | DABCO | 3.00% |
| Example 91 | Balance | MMB | 15.00% | Tetrazole | 0.20% | Compound D | 8 | | | | |

TABLE 4-1-continued

| | | | | | | | | | | |
|---|---|---|---|---|---|---|---|---|---|---|
| Example 92 | Balance | DEGBE/DMSO (mass ratio: 1/1) | 80.00% | Tetrazole | 0.20% | Compound D | 8 | | DBU | 0.10% |
| Example 93 | Balance | DEGBE/DMSO (mass ratio: 1/1) | 80.00% | Tetrazole | 0.20% | Compound D | 8 | | DBU | 0.10% |
| Example 94 | Balance | DMSO/PG/DEGBE (mass ratio: 3/2/2) | 68.00% | Tetrazole | 0.20% | Compound E | 10 | | THFA | 3.00% |
| Example 95 | Balance | DEGEE | 46.00% | 5-Aminotetrazole | 0.20% | Compound E | 10 | | THFA | 3.00% |
| Example 96 | Balance | DEGEE | 46.00% | Tetrazole | 0.20% | Compound D | 10 | | THFA | 3.00% |
| Example 97 | Balance | DEGEE | 46.00% | Tetrazole | 0.20% | Compound E | 15 | | THFA | 3.00% |
| Example 98 | Balance | DEGEE | 46.00% | Tetrazole | 0.20% | Compound C | 41 | | THFA | 3.00% |
| Example 99 | Balance | DEGEE | 46.00% | Tetrazole | 0.20% | Compound D | 10 | | 2AEPZ | 3.00% |
| Example 100 | Balance | DEGEE | 46.00% | Tetrazole | 0.20% | Compound D | 10 | | DBU | 3.00% |
| Example 101 | Balance | DEGEE | 46.00% | Tetrazole | 0.20% | Compound D | 10 | | DABCO | 3.00% |

| | Basic compound | | | | Co ion | | Other additives | | | | | | |
|---|---|---|---|---|---|---|---|---|---|---|---|---|---|
| | Ammonium hydroxide | | Secondary amine | | | Content | Additive 1 | | Additive 2 | | Additive 3 | | |
| | Name of compound | Content (% by mass) | Name of compound | Content (% by mass) | Type of Co ion source | (ppt by mass) of Co ion | Name of compound | Content (% by mass) | Name of compound | Content (% by mass) | Name of compound | Content (% by mass) |
| Example 75 | — | — | | | — | — | DTPA | 0.60% | — | — | — | — |
| Example 76 | — | — | | | — | — | DTPA | 0.60% | — | — | — | — |
| Example 77 | — | — | | | — | — | DTPA | 0.60% | — | — | — | — |
| Example 78 | — | — | | | — | — | DTPA | 0.60% | — | — | — | — |
| Example 79 | NH$_4$OH | 0.70% | | | — | — | HF | 0.40% | — | — | — | — |
| Example 80 | NH$_4$OH | 0.70% | | | — | — | HF | 0.40% | — | — | — | — |
| Example 81 | NH$_4$OH | 0.70% | | | — | — | HF | 0.40% | — | — | — | — |
| Example 82 | NH$_4$OH | 0.70% | | | — | — | HF | 0.40% | — | — | — | — |
| Example 83 | — | — | | | CoOx | 750.0 | HF | 0.40% | — | — | — | — |
| Example 84 | — | — | | | CoOx | 1500.0 | HF | 0.40% | — | — | — | — |
| Example 85 | — | — | | | CoOx | 250.0 | HF | 0.40% | — | — | — | — |
| Example 86 | — | — | | | CoOx | 50.0 | HF | 0.40% | — | — | — | — |
| Example 87 | — | — | | | — | — | — | — | — | — | — | — |
| Example 88 | — | — | | | — | — | — | — | — | — | — | — |
| Example 89 | — | — | | | — | — | — | — | — | — | — | — |
| Example 90 | — | — | | | — | — | — | — | — | — | — | — |
| Example 91 | — | — | | | CoOx | 750.0 | — | — | TMAH | 0.70% | — | — |
| Example 92 | — | — | | | — | — | — | — | — | — | — | — |
| Example 93 | — | — | | | — | — | DTPA | 0.30% | — | — | — | — |
| Example 94 | — | — | | | — | — | — | — | TMAH | 10.0% | TG | 5.00% |
| Example 95 | — | — | | | — | — | — | — | TMAH | 10.0% | TG | 5.00% |
| Example 96 | — | — | | | — | — | — | — | TMAH | 10.0% | TG | 5.00% |
| Example 97 | — | — | | | — | — | — | — | TMAH | 10.0% | TG | 5.00% |
| Example 98 | — | — | | | — | — | — | — | TMAH | 10.0% | TG | 5.00% |
| Example 99 | — | — | | | — | — | — | — | TMAH | 10.0% | TG | 5.00% |
| Example 100 | — | — | | | — | — | — | — | TMAH | 10.0% | TG | 5.00% |
| Example 101 | — | — | | | — | — | — | — | TMAH | 10.0% | TG | 5.00% |

TABLE 4-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | SiO₂ | | | | |
| | | | | | Measured value Å/min | Evaluation | Measured value Å/min | Evaluation | Measured value Å/min | Evaluation | Measured value Å/min | Evaluation | | | |
| Example 75 | 250 | — | — | — | 0.8 | B | 0.6 | B | 1.7 | C | 0.3 | A | A | A | — |
| Example 76 | 250 | — | — | — | 0.9 | B | 0.7 | B | 0.8 | B | 0.2 | A | A | A | — |
| Example 77 | 250 | — | — | — | 0.9 | B | 0.8 | B | 1.1 | C | 0.2 | A | A | A | — |
| Example 78 | 250 | — | — | — | 0.3 | A | 0.2 | A | 0.8 | B | 0.2 | A | A | A | — |
| Example 79 | 250 | — | — | — | 1.3 | C | 1.1 | C | 1.2 | C | 1.2 | C | C | C | — |
| Example 80 | 250 | — | — | — | 1.3 | C | 1.4 | C | 0.8 | B | 1.2 | C | B | B | — |
| Example 81 | 250 | — | — | — | 0.9 | B | 0.7 | B | 0.8 | B | 0.8 | B | B | B | — |
| Example 82 | 250 | — | — | — | 0.3 | A | 0.6 | B | 0.2 | A | 0.3 | B | A | B | — |
| Example 83 | 250 | 1.E+04 | — | 5.E+06 | 0.3 | A | 0.2 | A | 0.2 | A | 0.3 | A | A | B | A |
| Example 84 | 250 | 5.E+03 | — | 3.E+06 | 0.3 | A | 0.1 | A | 0.2 | A | 0.3 | A | B | B | — |
| Example 85 | 250 | 3.E+04 | — | 2.E+07 | 0.3 | A | 0.2 | A | 0.2 | A | 0.3 | A | A | B | — |
| Example 86 | 250 | 2.E+05 | — | 8.E+07 | 0.3 | A | 0.1 | A | 0.2 | A | 0.3 | A | B | B | — |
| Example 87 | 250 | — | — | — | 0.4 | A | 0.2 | A | 0.8 | B | 0.3 | A | B | B | — |
| Example 88 | 250 | — | — | — | 0.8 | B | 0.7 | B | 0.6 | B | 0.3 | A | B | B | — |
| Example 89 | 250 | — | — | — | 0.2 | A | 0.1 | A | 0.7 | B | 0.1 | A | A | A | — |
| Example 90 | 250 | — | — | — | 0.3 | A | 0.1 | A | 0.9 | B | 0.2 | A | B | B | — |
| Example 91 | 250 | 1.E+04 | — | — | 0.4 | A | 0.2 | A | 0.4 | A | 0.3 | A | A | A | — |
| Example 92 | 250 | — | — | — | 0.8 | B | 0.7 | B | 0.6 | B | 0.3 | A | B | B | — |
| Example 93 | 250 | — | — | — | 1.2 | C | 1.4 | C | 0.7 | B | 0.3 | A | A | A | — |
| Example 94 | 200 | — | — | — | 0.3 | A | 0.2 | A | 0.3 | A | 0.3 | A | B | A | — |
| Example 95 | 200 | — | — | — | 0.3 | A | 0.1 | A | 0.4 | B | 0.3 | A | A | A | A |
| Example 96 | 200 | — | — | — | 0.2 | A | 0.1 | A | 0.2 | A | 0.3 | A | A | A | — |
| Example 97 | 133 | — | — | — | 0.2 | A | 0.2 | A | 0.8 | B | 0.3 | A | A | B | — |
| Example 98 | 49 | — | — | — | 0.6 | B | 0.8 | B | 0.4 | A | 0.3 | A | B | B | — |
| Example 99 | 200 | — | — | — | 0.4 | A | 0.2 | A | 0.3 | A | 0.3 | A | A | A | — |
| Example 100 | 200 | — | — | — | 0.2 | A | 0.1 | A | 0.3 | A | 0.3 | A | A | A | — |
| Example 101 | 200 | — | — | — | 0.3 | A | 0.2 | A | 0.9 | B | 0.4 | A | B | B | — |

TABLE 5-1

| | Organic solvent | | | (A) | | Nitrogen-containing aromatic heterocyclic compound (B) | | (B)' | | Basic compound Nitrogen-containing alicyclic-compound | |
|---|---|---|---|---|---|---|---|---|---|---|---|
| | Water Content (% by mass) | Name of compound | Content (% by mass) | Name of compound | Content (% by mass) | Name of compound | Content (% by mass) | Name of compound | Content (% by mass) | Name of compound | Content (% by mass) |
| Example 102 | Balance | DEGEE | 68.00% | 5-MBTA | 0.02% | Compound X | 0.15 | | | DBU | 3.00% |
| Example 103 | Balance | DEGEE | 68.00% | 5-MBTA | 0.02% | Compound X | 0.15 | Compound Y | 0.01 | DBU | 3.00% |
| Example 104 | Balance | EG | 68.00% | 5-MBTA | 0.02% | Compound X | 0.15 | | | DBU | 3.00% |
| Example 105 | Balance | EG | 48.00% | 5-MBTA | 0.02% | Compound X | 0.15 | | | DBU | 3.00% |
| Example 106 | Balance | EG | 68.00% | 5-MBTA | 0.05% | Compound X | 0.15 | | | DBU | 3.00% |
| Example 107 | Balance | EG | 68.00% | 5-MBTA | 0.05% | Compound X | 0.15 | Compound Y | 0.01 | DBU | 3.00% |
| Example 108 | Balance | PG | 68.00% | 5-MBTA | 0.02% | Compound X | 0.15 | | | DBU | 3.00% |
| Example 109 | Balance | PG | 48.00% | 5-MBTA | 0.02% | Compound X | 0.15 | | | DBU | 3.00% |
| Example 110 | Balance | PG | 68.00% | 5-MBTA | 0.05% | Compound X | 0.15 | | | DBU | 3.00% |
| Example 111 | Balance | PG | 68.00% | 5-MBTA | 0.02% | Compound X | 0.15 | Compound Y | 0.01 | DBU | 3.00% |
| Example 112 | Balance | Glycerin | 68.00% | 5-MBTA | 0.02% | Compound X | 0.15 | | | DBU | 3.00% |
| Example 113 | Balance | Glycerin | 48.00% | 5-MBTA | 0.02% | Compound X | 0.15 | | | DBU | 3.00% |
| Example 114 | Balance | Glycerin | 68.00% | 5-MBTA | 0.05% | Compound X | 0.15 | | | DBU | 3.00% |
| Example 115 | Balance | Glycerin | 68.00% | 5-MBTA | 0.02% | Compound X | 0.15 | Compound Y | 0.01 | DBU | 3.00% |

TABLE 5-1-continued

| | | | | | | | | | | | |
|---|---|---|---|---|---|---|---|---|---|---|---|
| Example 116 | Balance | 3-Methoxy-1-butanol | 68.00% | 5-MBTA | 0.02% | Compound X | 0.15 | | | DBU | 3.00% |
| Example 117 | Balance | 3-Methoxy-1-butanol | 48.00% | 5-MBTA | 0.02% | Compound X | 0.15 | | | DBU | 3.00% |
| Example 118 | Balance | 3-Methoxy-1-butanol | 68.00% | 5-MBTA | 0.05% | Compound X | 0.15 | | | DBU | 3.00% |
| Example 119 | Balance | 3-Methoxy-1-butanol | 68.00% | 5-MBTA | 0.02% | Compound X | 0.15 | Compound Y | 0.15 | DBU | 3.00% |

| | Basic compound | | | | Co ion | Other additives | | | | | |
|---|---|---|---|---|---|---|---|---|---|---|---|
| | Ammonium hydroxide | | Secondary amine | | Content | Additive 1 | | Additive 2 | | Additive 3 | |
| | Name of compound | Content (% by mass) | Name of compound | Content (% by mass) | Name of compound | (ppt by mass) of Co ion | Name of compound | Content (% by mass) | Name of compound | Content (% by mass) | Name of compound | Content (% by mass) |
| Example 102 | — | — | IE | 0.02% | — | — | — | — | TMAH | 10.0% | | |
| Example 103 | — | — | IE | 0.02% | — | — | — | — | TMAH | 10.0% | | |
| Example 104 | — | — | IE | 0.02% | — | — | — | — | HA | 5.0% | | |
| Example 105 | — | — | IE | 0.02% | — | — | — | — | HA | 5.0% | | |
| Example 106 | — | — | IE | 0.02% | — | — | — | — | HA | 5.0% | | |
| Example 107 | — | — | IE | 0.02% | — | — | — | — | HA | 5.0% | | |
| Example 108 | — | — | IE | 0.02% | — | — | — | — | HA | 5.0% | | |
| Example 109 | — | — | IE | 0.02% | — | — | — | — | HA | 5.0% | | |
| Example 110 | — | — | IE | 0.02% | — | — | — | — | HA | 5.0% | | |
| Example 111 | — | — | IE | 0.02% | — | — | — | — | HA | 5.0% | | |
| Example 112 | — | — | IE | 0.02% | — | — | — | — | HA | 5.0% | | |
| Example 113 | — | — | IE | 0.02% | — | — | — | — | HA | 5.0% | | |
| Example 114 | — | — | IE | 0.02% | — | — | — | — | HA | 5.0% | | |
| Example 115 | — | — | IE | 0.02% | — | — | — | — | HA | 5.0% | | |
| Example 116 | — | — | IE | 0.02% | — | — | — | — | HA | 5.0% | | |
| Example 117 | — | — | IE | 0.02% | — | — | — | — | HA | 5.0% | | |
| Example 118 | — | — | IE | 0.02% | — | — | — | — | HA | 5.0% | | |
| Example 119 | — | — | IE | 0.02% | — | — | — | — | HA | 5.0% | | |

TABLE 5-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties | Resist residue peeling properties |
|---|---|---|---|---|---|---|---|---|---|---|---|---|---|---|---|
| | | | | | Co | | Cu | | W | | SiO$_2$ | | | | |
| | | | | | Measured value Å/min | Evaluation | Measured value Å/min | Evaluation | Measured value Å/min | Evaluation | Measured value Å/min | Evaluation | | | |
| Example 102 | 1,333 | — | — | — | 0.3 | A | 0.2 | A | 0.3 | A | 0.1 | A | B | A | A |
| Example 103 | 1,250 | — | — | — | 0.2 | A | 0.2 | A | 0.2 | A | 0.1 | A | B | A | A |
| Example 104 | 1,333 | — | — | — | 0.3 | A | 0.2 | A | 0.5 | B | 0.1 | A | A | A | — |
| Example 105 | 1,333 | — | — | — | 0.8 | B | 0.4 | B | 1.2 | B | 0.1 | A | B | B | — |
| Example 106 | 3,333 | — | — | — | 0.2 | A | 0.1 | A | 0.3 | A | 0.1 | A | A | B | — |
| Example 107 | 3,125 | — | — | — | 0.1 | A | 0.1 | A | 0.2 | A | 0.1 | A | A | A | — |
| Example 108 | 1,333 | — | — | — | 0.4 | A | 0.2 | A | 0.6 | A | 0.1 | A | A | A | — |
| Example 109 | 1,333 | — | — | — | 0.9 | B | 0.5 | B | 1.4 | C | 0.1 | A | B | B | — |
| Example 110 | 3,333 | — | — | — | 0.2 | A | 0.1 | A | 0.3 | A | 0.1 | A | A | B | — |
| Example 111 | 1,250 | — | — | — | 0.2 | A | 0.1 | A | 0.3 | A | 0.1 | A | A | A | — |
| Example 112 | 1,333 | — | — | — | 0.1 | A | 0.1 | A | 0.2 | A | 0.1 | A | A | A | — |

TABLE 5-2-continued

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | Residue removing properties | Defect suppressing properties | Resist residue peeling properties |
|---|---|---|---|---|---|---|---|---|---|---|---|---|---|---|
| | | | | | Co Measured value Å/min | Evaluation | Cu Measured value Å/min | Evaluation | W Measured value Å/min | Evaluation | SiO$_2$ Measured value Å/min | Evaluation | | | |
| Example 113 | 1,333 | — | — | — | 0.7 | B | 0.4 | B | 1.1 | C | 0.1 | A | B | B | — |
| Example 114 | 3,333 | — | — | — | 0.1 | A | 0.1 | A | 0.2 | A | 0.1 | A | A | B | — |
| Example 115 | 1,250 | — | — | — | 0.1 | A | 0.1 | A | 0.2 | A | 0.1 | A | A | A | — |
| Example 116 | 1,333 | — | — | — | 0.4 | A | 0.2 | A | 0.6 | B | 0.1 | A | A | A | — |
| Example 117 | 1,333 | — | — | — | 0.8 | B | 0.4 | B | 1.2 | c | 0.1 | A | B | B | — |
| Example 118 | 3,333 | — | — | — | 0.3 | A | 0.2 | A | 0.5 | B | 0.1 | A | A | B | — |
| Example 119 | 667 | — | — | — | 0.2 | A | 0.1 | A | 0.3 | B | 0.1 | A | A | A | — |

TABLE 6-1

| | Water Content (% by mass) | Organic solvent | | Nitrogen-containing aromatic heterocyclic compound | | | | | | Basic compound Nitrogen-containing alicyclic-compound | |
|---|---|---|---|---|---|---|---|---|---|---|---|
| | | Name of compound | Content (% by mass) | Name of compound | Content (% by mass) | Name of compound | Content (% by mass) | Name of compound | Content (% by mass) | Name of compound | Content (% by mass) |
| Comparative Example 1 | Balance | EGBE | 3.00% | 5MBTA | 0.20% | — | — | — | — | — | — |
| Comparative Example 2 | Balance | DEGBE | 69.00% | BTA | 0.20% | — | — | — | — | NH$_4$OH | 0.70% |
| Comparative Example 3 | Balance | MMB | 15.00% | BTA | 0.20% | — | — | — | — | THFA | 3.00% |
| Comparative Example 4 | Balance | DMSO/PG/DEGBE (mass ratio: 3/2/2) | 68.00% | IRGAMET42 | 0.20% | — | — | — | — | — | — |
| Comparative Example 5 | — | EGBE | Balance | 5MBTA | 0.20% | — | — | — | — | DBU | 0.76% |
| Comparative Example 6 | Balance | — | — | 5MBTA | 0.20% | — | — | — | — | DBU | 0.76% |

| | Basic compound | | | | Co ion | Other additives | | | | | |
|---|---|---|---|---|---|---|---|---|---|---|---|
| | Ammonium hydroxide | | Secondary amine | | Content (ppt by mass) of Co ion | Additive 1 | | Additive 2 | | Additive 3 | |
| | Name of compound | Content (% by mass) | Name of compound | Content (% by mass) | | Name of compound | Content (% by mass) | Name of compound | Content (% by mass) | Name of compound | Content (% by mass) |
| Comparative Example 1 | — | — | — | — | — | — | — | — | — | — | — |

TABLE 6-1-continued

| | | | | | | | | | | | |
|---|---|---|---|---|---|---|---|---|---|---|---|
| Comparative Example 2 | — | — | — | — | — | — | HF | 0.40% | — | — | — |
| Comparative Example 3 | — | — | — | — | — | — | — | — | TMAH | 0.70% | — | — |
| Comparative Example 4 | — | — | — | — | — | — | — | — | TMAH | 10.0% | TG | 5.00% |
| Comparative Example 5 | — | — | — | — | — | — | — | — | — | — | — | — |
| Comparative Example 6 | — | — | — | — | — | — | — | — | — | — | — | — |

TABLE 6-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | Residue removing properties | Defect suppressing properties |
|---|---|---|---|---|---|---|---|---|---|---|---|---|---|---|
| | | | | | Co | | Cu | | W | | SiO$_2$ | | | |
| | | | | | Measured value Å/min | Evaluation | Measured value Å/min | Evaluation | Measured value Å/min | Evaluation | Measured value Å/min | Evaluation | | |
| Comparative Example 1 | — | — | — | — | 6.7 | E | 4.3 | E | 2.7 | D | 0.2 | A | D | D |
| Comparative Example 2 | — | — | — | — | 4.5 | E | 3.2 | E | 3.0 | D | 1.2 | C | C | C |
| Comparative Example 3 | — | — | — | — | 2.7 | D | 2.4 | D | 1.5 | C | 0.6 | B | B | B |
| Comparative Example 4 | — | — | — | — | 3.1 | D | 2.7 | D | 1.3 | C | 0.4 | A | C | C |
| Comparative Example 5 | — | — | — | — | 0.8 | B | 0.4 | A | 0.2 | A | 0.3 | A | E | D |
| Comparative Example 6 | — | — | — | — | 5.1 | E | 4.5 | E | 7.1 | E | 1.4 | C | C | D |

From the results in the tables, it is clear that with the treatment liquids of Examples, the anticorrosion properties for an object to be treated (anticorrosion properties for a metal layer), the residue removing properties, and the defect suppressing properties are excellent.

On the other hand, it is clear that with the treatment liquids of Comparative Examples, the anticorrosion properties for a metal layer, the residue removing properties, and the defect suppressing properties are not all satisfied Moreover, from the comparison of Example 4, and Examples 19 to 23, it was confirmed that in a case where the mass content ratio of the nitrogen-containing aromatic heterocyclic compound (A) to the nitrogen-containing aromatic heterocyclic compound (B) in the treatment liquid of the embodiment of the present invention is 100 or more, the residue removing properties and the defect suppressing properties are more excellent, and in a case where the mass content ratio is 15,000 or less, the anticorrosion properties for a metal layer are more excellent.

Furthermore, from the comparison of Example 4, and Examples 19 to 23, it was confirmed that in a case where the content of the nitrogen-containing aromatic heterocyclic compound (B) in the treatment liquid of the embodiment of the present invention is 0.5 ppm by mass or more with respect to a total mass of the treatment liquid, the anticorrosion properties for a metal layer are more excellent, and in a case where the content is 80 ppm by mass or less, the residue removing properties and the defect suppressing properties are more excellent.

In addition, from the comparison of Example 1, and Examples 5 to 10, the comparison of Example 2, and Examples 11 to 14, and the comparison of Examples 33 to 35, it was confirmed that in a case where the mass content ratio of the nitrogen-containing aromatic heterocyclic compound (B) to the cobalt ion is $1.0 \times 10^4$ or more, the residue removing properties and the defect suppressing properties are more excellent, and in a case where the mass content ratio is $1.0 \times 10^5$ or less, the anticorrosion properties for a metal layer are more excellent.

Moreover, from the comparison of Examples 32 to 35, it was confirmed that in a case where the mass content ratio of the fluorine-containing compound to the cobalt ion is $4.0 \times 10^6$ to $5.0 \times 10^7$, the residue removing properties are more excellent.

Furthermore, from the comparison of Example 2, and Examples 11 to 14, it was confirmed that in a case where the mass content ratio of the basic compound to the cobalt ion is $1.0 \times 10^7$ or more, the residue removing properties and the defect suppressing properties are more excellent, and in a case where the mass content ratio is $1.0 \times 10^8$ or less, the anticorrosion properties are more excellent.

In addition, from the comparison of Example 1, and Examples 5 to 10, from the comparison of Example 2, and Examples 11 to 14, and from the comparison of Examples 33 to 35, it was confirmed that in a case where the content of the cobalt ion is 100 ppt by mass or more with respect to a total mass of the treatment liquid, the anticorrosion properties for a metal layer are more excellent, and in a case where the content is 1,200 ppt by mass or less, the residue removing properties and the defect suppressing properties are more excellent.

Moreover, from the comparison of Example 4, and Examples 15 and 16, it was confirmed that in a case where the nitrogen-containing aromatic heterocyclic compound having a benzotriazole skeleton (a structure of the compound represented by General Formula (I), in which $R^{11}$ and $R^{12}$ are bonded to form a ring, is used as the nitrogen-containing aromatic heterocyclic compound (A), and the compound represented by General Formula (III) is used as the nitrogen-containing aromatic heterocyclic compound (B), the anticorrosion properties for a metal layer, the residue removing properties, and the defect suppressing properties are more excellent.

Furthermore, from the comparison of Example 4, and Example 17 and 18, it was confirmed that in a case where the nitrogen-containing aromatic heterocyclic compound having a benzotriazole skeleton having a substituent on a ring formed by bonding of $R^{11}$ and $R^{12}$ (a structure of the compound represented by General Formula (I), in which $R^{11}$ and $R^{12}$ are bonded to form a ring) is used as the nitrogen-containing aromatic heterocyclic compound (A), the residue removing properties and the defect suppressing properties are more excellent.

In addition, from the comparison of Example 3, and Examples 24 to 27, it was confirmed that in a case where two or more nitrogen-containing alicyclic compounds are included as the basic compound (preferably a case where one or more selected from the group consisting of 1,8-diazabicyclo[5.4.0]-7-undecene (DBU), ε-caprolactam, the compound 1, the compound 2, and the compound 3 are included), the anticorrosion properties for a metal layer, the residue removing properties, and the defect suppressing properties are more excellent.

[Preparation of Treatment Liquid]

By the same method as for the treatment liquid of Example 36, except that the content of the basic compound was set to the blend amount described in Table 7-1, each of treatment liquids of Examples 120 to 122 was prepared. Further, in each of the treatment liquids, the contents (all based on mass) of various components are as described in the tables. In addition, the pH of each of the obtained treatment liquids of Examples 120 to 122 was measured using a known pH meter.

The results are shown in Table 2.

In addition, the compositions of the treatment liquids (Examples 120 to 122) shown in Table 7-1 are shown in Table 2, and various compositional ratios and evaluation results of the treatment liquids shown in Table 7-1 are shown in Table 7-2.

TABLE 7-1

| | Water Content (% by mass) | Organic solvent Name of compound | Organic solvent Content (% by mass) | Nitrogen-containing aromatic heterocyclic compound Name of compound | Content (% by mass) | Name of compound | Content (% by mass) | Name of compound | Content (% by mass) | Basic compound Nitrogen-containing alicyclic-compound Name of compound | Content (% by mass) |
|---|---|---|---|---|---|---|---|---|---|---|---|
| Example 36 | Balance | MMB | 15.00% | 5MBTA | 0.20% | Compound A | 8 | Compound A | 8 | THFA | 3.00% |
| Example 120 | Balance | MMB | 15.00% | 5MBTA | 0.20% | Compound A | 8 | Compound A | 8 | THFA | 4.00% |
| Example 121 | Balance | MMB | 15.00% | 5MBTA | 0.20% | Compound A | 8 | Compound A | 8 | THFA | 4.50% |
| Example 122 | Balance | MMB | 15.00% | 5MBTA | 0.20% | Compound A | 8 | Compound A | 8 | THFA | 5.00% |

| | Basic compound Ammonium hydroxide Name of compound | Content (% by mass) | Basic compound Secondary amine Name of compound | Content (% by mass) | Co ion Name of compound | Content (ppt by mass) of Co ion | Other additives Additive 1 Name of compound | Content (% by mass) | Other additives Additive 2 Name of compound | Content (% by mass) | Other additives Additive 3 Name of compound | Content (% by mass) |
|---|---|---|---|---|---|---|---|---|---|---|---|---|
| Example 36 | — | — | — | — | — | — | — | — | — | — | — | — |
| Example 120 | — | — | — | — | — | — | — | — | HA | 10 | — | — |
| Example 121 | — | — | — | — | — | — | — | — | HA | 10 | — | — |
| Example 122 | — | — | — | — | — | — | — | — | HA | 10 | — | — |

TABLE 7-2

| | Mass content ratio of nitrogen-containing aromatic heterocyclic compound (A) to nitrogen-containing aromatic heterocyclic compound (B) | Mass content ratio of nitrogen-containing aromatic heterocyclic compound (B) to Co ion | Mass content ratio of basic compound to Co ion | Mass content ratio of fluorine-containing to Co ion | Anticorrision properties | | | | | | | | | Residue removing properties | Defect suppressing properties | Resist residue peeling properties |
|---|---|---|---|---|---|---|---|---|---|---|---|---|---|---|---|---|
| | | | | | Co | | Cu | | W | | SiO$_2$ | | | | | |
| | | | | | Measured value Å/min | Evaluation | Measured value Å/min | Evaluation | Measured value Å/min | Evaluation | Measured value Å/min | Evaluation | | | | |
| Example 36 | 250 | — | — | — | 0.4 | A | 0.2 | A | 0.8 | B | 0.3 | A | B | B | 11 |
| Example 120 | 250 | — | — | — | 0.2 | A | 0.1 | A | 0.3 | A | 0.3 | A | A | A | 12 |
| Example 121 | 250 | — | — | — | 0.3 | A | 0.1 | A | 0.4 | B | 0.3 | A | A | A | 13 |
| Example 122 | 250 | — | — | — | 0.8 | A | 0.2 | A | 0.8 | B | 0.5 | B | B | B | 14 |

From the results in Table 7-2, it is clear that the treatment liquids have excellent anticorrosion properties for a metal layer, residue removing properties, and defect suppressing properties even in a case where the treatment liquids have different pHs. In addition, it is clear that in a case where the pH of the treatment liquid is 13 or less (preferably a case where the pH is more than 11 and 13 or less), the anticorrosion properties for a metal layer, the residue removing properties, and the defect suppressing properties are more excellent.

OF REFERENCES 1 substrate
2 metal layer
3 etching stop layer
4 interlayer insulating film
5 metal hard mask
6 hole
10 laminate
11 inner wall
11a cross-sectional wall
11b bottom wall
12 dry etching residue

What is claimed is:

1. A treatment liquid for a semiconductor device, comprising:
water;
an organic solvent;
two or more nitrogen-containing aromatic heterocyclic compounds; and
at least one selected from the group consisting of hydroxylamine, a hydroxylamine derivative, and a salt thereof.

2. The treatment liquid according to claim 1,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) is at least one selected from the group consisting of a compound represented by General Formula (II), a compound represented by General Formula (III), and a compound represented by General Formula (V),

(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

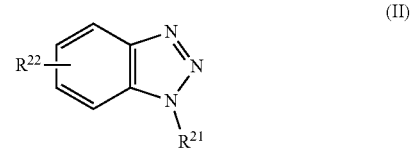

(II)

in General Formula (II), $R^{21}$ and $R^{22}$ each independently represent a hydrogen atom, a hydroxyl group, or a substituted or unsubstituted hydrocarbon group,
provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I)

are bonded to each other to form a benzene ring, and the benzene ring has a substituent, $R^{22}$ and the substituent represent different groups,

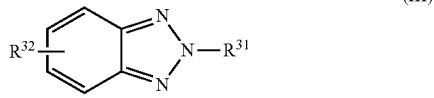

(III)

in General Formula (III), $R^{31}$ and $R^{32}$ each independently represent a hydrogen atom, or a substituted or unsubstituted hydrocarbon group, provided that in a case where $R^{31}$ is the hydrogen atom, $R^{32}$ represents a substituted or unsubstituted hydrocarbon group, and in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

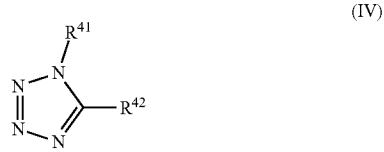

(IV)

in General Formula (IV), $R^{41}$ represents a hydrogen atom, and $R^{42}$ represents a hydrogen atom, a hydroxyl group, a mercapto group, or an amino group,

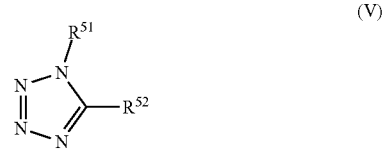

(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group.

3. The treatment liquid according to claim 2, wherein the nitrogen-containing aromatic heterocyclic compound (A) is the compound represented by General Formula (I), in which $R^{11}$ and $R^{12}$ is bonded to each other to form a ring, and the nitrogen-containing aromatic heterocyclic compound (B) is the compound represented by General Formula (III).

4. The treatment liquid according to claim 2, wherein a mass content ratio of the nitrogen-containing aromatic heterocyclic compound (A) to the nitrogen-containing aromatic heterocyclic compound (B) is 2 to 30,000.

5. The treatment liquid according to claim 2, wherein a mass content ratio of the nitrogen-containing aromatic heterocyclic compound (A) to the nitrogen-containing aromatic heterocyclic compound (B) is 100 to 15,000.

6. The treatment liquid according to claim 2, wherein the nitrogen-containing aromatic heterocyclic compound (B) includes two compounds selected from the group consisting of the compound represented by General Formula (II), the compound represented by General Formula (III), and the compound represented by General Formula (V), and a mass ratio of the two compounds is 1 to 10,000.

7. The treatment liquid according to claim 2, wherein a content of the nitrogen-containing aromatic heterocyclic compound (B) is 0.01 to 10,000 ppm by mass with respect to a total mass of the treatment liquid.

8. The treatment liquid according to claim 2, wherein a content of the nitrogen-containing aromatic heterocyclic compound (B) is 0.5 to 80 ppm by mass with respect to a total mass of the treatment liquid.

9. The treatment liquid according to claim 1, further comprising a cobalt ion.

10. The treatment liquid according to claim 9, wherein the cobalt ion is a cobalt ion derived from at least one cobalt ion source selected from the group consisting of cobalt fluoride, cobalt chloride, cobalt hydroxide, cobalt oxide, and cobalt sulfate.

11. The treatment liquid according to claim 9, wherein a mass content ratio of the nitrogen-containing aromatic heterocyclic compound (B) to the cobalt ion is $1.0 \times 10^2$ to $1.0 \times 10^6$.

12. The treatment liquid according to claim 1, further comprising one or more fluorine-containing compounds selected from the group consisting of hydrofluoric acid, ammonium fluoride, tetramethylammonium fluoride, and tetrabutylammonium fluoride.

13. The treatment liquid according to claim 12, further comprising a cobalt ion.

14. The treatment liquid according to claim 13, wherein the cobalt ion is a cobalt ion derived from at least one cobalt ion source selected from the group consisting of cobalt fluoride, cobalt chloride, cobalt hydroxide, cobalt oxide, and cobalt sulfate.

15. The treatment liquid according to claim 13, wherein a mass content ratio of the fluorine-containing compound to the cobalt ion is $1.0 \times 10^5$ to $1.0 \times 10^8$.

16. The treatment liquid according to claim 1, further comprising a basic compound.

17. The treatment liquid according to claim 16, wherein the basic compound includes a nitrogen-containing alicyclic compound.

18. The treatment liquid according to claim 16, wherein the basic compound includes a secondary amine.

19. The treatment liquid according to claim 18, wherein a content of the secondary amine is 300 ppb by mass to 3,000 ppm by mass with respect to a total mass of the treatment liquid.

20. The treatment liquid according to claim 18, wherein a nitrogen-containing aromatic heterocyclic compound (A) and a nitrogen-containing aromatic heterocyclic compound (B) are included as the nitrogen-containing aromatic heterocyclic compounds, the nitrogen-containing aromatic heterocyclic compound (A) is a compound represented by General Formula (I) or a compound represented by General Formula (IV), and the nitrogen-containing aromatic heterocyclic compound (B) is at least one selected from the group consisting of a compound represented by General Formula (II), a compound represented by General Formula (III), and a compound represented by General Formula (V),

(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

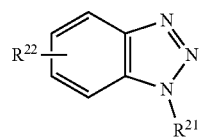
(II)

in General Formula (II), $R^{21}$ and $R^{22}$ each independently represent a hydrogen atom, a hydroxyl group, or a substituted or unsubstituted hydrocarbon group,
provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups,

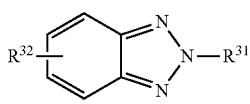
(III)

in General Formula (III), $R^{31}$ and $R^{32}$ each independently represent a hydrogen atom, or a substituted or unsubstituted hydrocarbon group,
provided that in a case where $R^{31}$ is the hydrogen atom, $R^{32}$ represents a substituted or unsubstituted hydrocarbon group, and in a case where IC is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

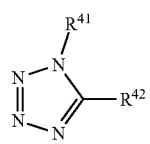
(IV)

in General Formula (IV), $R^{41}$ represents a hydrogen atom, and $R^{42}$ represents a hydrogen atom, a hydroxyl group, a mercapto group, or an amino group,

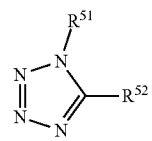
(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group, and
a ratio of the mass of the nitrogen-containing aromatic heterocyclic compound (B) to the mass of the secondary amine is 1 to 10,000.

21. The treatment liquid according to claim 16, further comprising a cobalt ion.

22. The treatment liquid according to claim 21,
wherein the cobalt ion is a cobalt ion derived from at least one cobalt ion source selected from the group consisting of cobalt fluoride, cobalt chloride, cobalt hydroxide, cobalt oxide, and cobalt sulfate.

23. The treatment liquid according to claim 21,
wherein a mass content ratio of the basic compound to the cobalt ion is $1.0 \times 10^5$ to $1.0 \times 10^9$.

24. The treatment liquid according to claim 1,
wherein the organic solvent includes at least one selected from the group consisting of a glycol-based solvent, a glycol ether-based solvent, an amide-based solvent, an alcohol-based solvent, and a sulfoxide-based solvent.

25. The treatment liquid according to claim 1,
wherein the treatment liquid is used as a washing liquid for removing etching residues, a solution for removing a resist film used for pattern formation, a washing liquid for removing residues from a substrate after chemical mechanical polishing, or an etching liquid.

26. The treatment liquid according to claim 9,
wherein a content of the water is 10% to 97% by mass with respect to a total mass of the treatment liquid,
a content of the organic solvent is 1% to 85% by mass with respect to a total mass of the treatment liquid,
a content of the nitrogen-containing aromatic heterocyclic compound is 0.05% to 5% by mass with respect to a total mass of the treatment liquid, and
a content of the cobalt ion is 0.001 to 10 ppb by mass with respect to a total mass of the treatment liquid.

27. A kit comprising the treatment liquid according to claim 1 and solvent selected from the group consisting of water, isopropanolamine, and a dilute solution including ammonia.

28. A method for washing a substrate, comprising:
washing a substrate with the treatment liquid according to claim 1,
wherein the substrate has a metal layer including any one or more selected from the group consisting of Co, W, and Cu.

29. The method for washing a substrate according to claim 28,
wherein the substrate further has a metal hard mask including at least one component selected from the group consisting of Cu, Co, a Co alloy, W, a W alloy, Ru, an Ru alloy, Ta, a Ta alloy, AlOx, AlN, AlOxNy, TiAl, Ti, TiN, TiOx, ZrOx, HfOx, TaOx, LaOx, and YSiOx, and x and y are a number satisfying x=1 to 3 and a number satisfying y=1 or 2, respectively.

30. A treatment liquid for a semiconductor device, comprising:
water;
an organic solvent;
two or more nitrogen-containing aromatic heterocyclic compounds; and
a basic compound,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) is at least one selected from the group consisting of a compound represented by General Formula (II), a compound represented by General Formula (III), and a compound represented by General Formula (V),

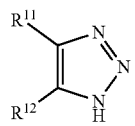

(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

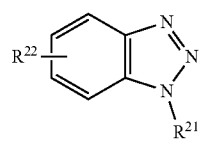

(II)

in General Formula (II), $R^{21}$ and $R^{22}$ each independently represent a hydrogen atom, a hydroxyl group, or a substituted or unsubstituted hydrocarbon group,
provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups,

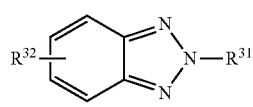

(III)

in General Formula (III), $R^{31}$ and $R^{32}$ each independently represent a hydrogen atom, or a substituted or unsubstituted hydrocarbon group,
provided that in a case where $R^{31}$ is the hydrogen atom, $R^{32}$ represents a substituted or unsubstituted hydrocarbon group, and in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

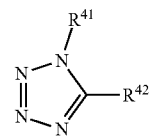

(IV)

in General Formula (IV), $R^{41}$ represents a hydrogen atom, and $R^{42}$ represents a hydrogen atom, a hydroxyl group, a mercapto group, or an amino group,

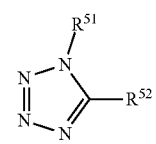

(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group,
the basic compound includes a secondary amine, and
a ratio of the mass of the nitrogen-containing aromatic heterocyclic compound (B) to the mass of the secondary amine is 1 to 10,000.

31. The treatment liquid according to claim 30, wherein a content of the nitrogen-containing aromatic heterocyclic compound (B) is 0.01 to 10,000 ppm by mass with respect to a total mass of the treatment liquid.

32. The treatment liquid according to claim 30, wherein a content of the nitrogen-containing aromatic heterocyclic compound (B) is 0.5 to 80 ppm by mass with respect to a total mass of the treatment liquid.

33. The treatment liquid according to claim 30, further comprising one or more fluorine-containing compounds selected from the group consisting of hydrofluoric acid, ammonium fluoride, tetramethylammonium fluoride, and tetrabutylammonium fluoride.

34. The treatment liquid according to claim 30, wherein the treatment liquid is used as a washing liquid for removing etching residues, a solution for removing a resist film used for pattern formation, a washing liquid for removing residues from a substrate after chemical mechanical polishing, or an etching liquid.

35. A treatment liquid for a semiconductor device, comprising:
water;
an organic solvent;
two or more nitrogen-containing aromatic heterocyclic compounds; and
a cobalt ion.

36. The treatment liquid according to claim 35,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) is at least one selected from the group consisting of a compound represented by General Formula (II), a compound represented by General Formula (III), and a compound represented by General Formula (V),

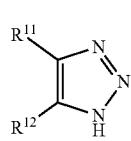
(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

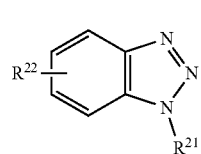
(II)

in General Formula (II), $R^{21}$ and $R^{22}$ each independently represent a hydrogen atom, a hydroxyl group, or a substituted or unsubstituted hydrocarbon group,
provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups,

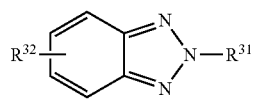
(III)

in General Formula (III), $R^{31}$ and $R^{32}$ each independently represent a hydrogen atom, or a substituted or unsubstituted hydrocarbon group,
provided that in a case where $R^{31}$ is the hydrogen atom, $R^{32}$ represents a substituted or unsubstituted hydrocarbon group, and in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

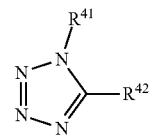
(IV)

in General Formula (IV), $R^{41}$ represents a hydrogen atom, and $R^{42}$ represents a hydrogen atom, a hydroxyl group, a mercapto group, or an amino group,

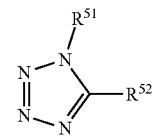
(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group.

37. The treatment liquid according to claim 36,
wherein a content of the nitrogen-containing aromatic heterocyclic compound (B) is 0.01 to 10,000 ppm by mass with respect to a total mass of the treatment liquid.

38. The treatment liquid according to claim 36,
wherein a content of the nitrogen-containing aromatic heterocyclic compound (B) is 0.5 to 80 ppm by mass with respect to a total mass of the treatment liquid.

39. The treatment liquid according to claim 35, further comprising one or more fluorine-containing compounds selected from the group consisting of hydrofluoric acid, ammonium fluoride, tetramethylammonium fluoride, and tetrabutylammonium fluoride.

40. The treatment liquid according to claim 35, further comprising a basic compound.

41. The treatment liquid according to claim 35,
wherein the treatment liquid is used as a washing liquid for removing etching residues, a solution for removing a resist film used for pattern formation, a washing liquid for removing residues from a substrate after chemical mechanical polishing, or an etching liquid.

42. A treatment liquid for a semiconductor device, comprising:
water;
an organic solvent; and
two or more nitrogen-containing aromatic heterocyclic compounds,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) is at least one selected from the group consisting of a compound represented by General Formula (II), a compound represented by General Formula (III), and a compound represented by General Formula (V),

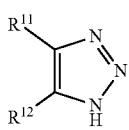
(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

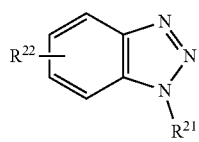
(II)

in General Formula (II), $R^{21}$ and $R^{22}$ each independently represent a hydrogen atom, a hydroxyl group, or a substituted or unsubstituted hydrocarbon group, provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups,

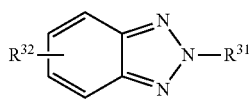
(III)

in General Formula (III), $R^{31}$ and $R^{32}$ each independently represent a hydrogen atom, or a substituted or unsubstituted hydrocarbon group, provided that in a case where $R^{31}$ is the hydrogen atom, $R^{32}$ represents a substituted or unsubstituted hydrocarbon group, and in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

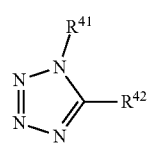
(IV)

in General Formula (IV), $R^{41}$ represents a hydrogen atom, and $R^{42}$ represents a hydrogen atom, a hydroxyl group, a mercapto group, or an amino group,

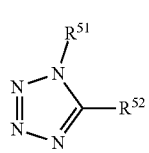
(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group, and a mass content ratio of the nitrogen-containing aromatic heterocyclic compound (A) to the nitrogen-containing aromatic heterocyclic compound (B) is 2 to 30,000.

43. The treatment liquid according to claim 42, wherein a content of the nitrogen-containing aromatic heterocyclic compound (B) is 0.01 to 10,000 ppm by mass with respect to a total mass of the treatment liquid.

44. The treatment liquid according to claim 42, wherein a content of the nitrogen-containing aromatic heterocyclic compound (B) is 0.5 to 80 ppm by mass with respect to a total mass of the treatment liquid.

45. The treatment liquid according to claim 42, further comprising one or more fluorine-containing compounds selected from the group consisting of hydrofluoric acid, ammonium fluoride, tetramethylammonium fluoride, and tetrabutylammonium fluoride.

46. The treatment liquid according to claim 42, further comprising a basic compound.

47. The treatment liquid according to claim 42, wherein the treatment liquid is used as a washing liquid for removing etching residues, a solution for removing a resist film used for pattern formation, a washing liquid for removing residues from a substrate after chemical mechanical polishing, or an etching liquid.

48. A treatment liquid for a semiconductor device, comprising:
water;
an organic solvent; and
two or more nitrogen-containing aromatic heterocyclic compounds,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) includes two compounds selected from the group consisting of a compound represented by General Formula (II), a compound represented by General Formula (III), and a compound represented by General Formula (V),

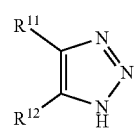
(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring,

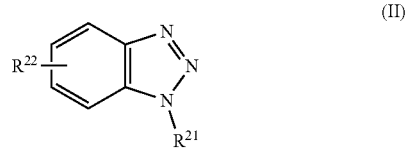

(II)

in General Formula (II), $R^{21}$ and $R^{22}$ each independently represent a hydrogen atom, a hydroxyl group, or a substituted or unsubstituted hydrocarbon group, provided that in a case where $R^{21}$ is the hydrogen atom, $R^{22}$ represents a substituted or unsubstituted hydrocarbon group, and in a case where $R^{21}$ is the hydrogen atom, $R^{22}$ represents the substituted or unsubstituted hydrocarbon group, $R^{11}$ and $R^{12}$ in General Formula (I) are bonded to each other to form a benzene ring, and the benzene ring has a substituent, $R^{22}$ and the substituent represent different groups,

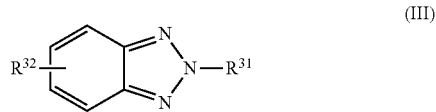

(III)

in General Formula (III), $R^{31}$ and $R^{32}$ each independently represent a hydrogen atom, or a substituted or unsubstituted hydrocarbon group, provided that in a case where $R^{31}$ is the hydrogen atom, $R^{32}$ represents a substituted or unsubstituted hydrocarbon group, and in a case where $R^{31}$ is the hydrogen atom, $R^{32}$ represents the substituted or unsubstituted hydrocarbon group, $R^{11}$ and $R^{12}$ in General Formula (I) are bonded to each other to form a benzene ring, and the benzene ring has a substituent, $R^{32}$ and the substituent represent different groups,

(IV)

in General Formula (IV), $R^{41}$ represents a hydrogen atom, and $R^{42}$ represents a hydrogen atom, a hydroxyl group, a mercapto group, or an amino group,

(V)

in General Formula (V), $R^{51}$ and $R^{52}$ each independently represent a hydrogen atom, or a substituted or unsubstituted hydrocarbon group, provided that at least one of $R^{51}$ or $R^{52}$ represents a substituted or unsubstituted hydrocarbon group, and a mass ratio of the two compounds as the nitrogen-containing aromatic heterocyclic compound (B) is 1 to 10,000.

49. The treatment liquid according to claim 48, wherein a content of the nitrogen-containing aromatic heterocyclic compound (B) is 0.01 to 10,000 ppm by mass with respect to a total mass of the treatment liquid.

50. The treatment liquid according to claim 48, wherein a content of the nitrogen-containing aromatic heterocyclic compound (B) is 0.5 to 80 ppm by mass with respect to a total mass of the treatment liquid.

51. The treatment liquid according to claim 48, further comprising one or more fluorine-containing compounds selected from the group consisting of hydrofluoric acid, ammonium fluoride, tetramethylammonium fluoride, and tetrabutylammonium fluoride.

52. The treatment liquid according to claim 48, further comprising a basic compound.

53. The treatment liquid according to claim 48, wherein the treatment liquid is used as a washing liquid for removing etching residues, a solution for removing a resist film used for pattern formation, a washing liquid for removing residues from a substrate after chemical mechanical polishing, or an etching liquid.

54. A treatment liquid for a semiconductor device, comprising:
water;
an organic solvent; and
two or more nitrogen-containing aromatic heterocyclic compounds,
wherein a nitrogen-containing aromatic heterocyclic compound (A) and a nitrogen-containing aromatic heterocyclic compound (B) are included as the nitrogen-containing aromatic heterocyclic compounds,
the nitrogen-containing aromatic heterocyclic compound (A) is a compound represented by General Formula (I) or a compound represented by General Formula (IV), and
the nitrogen-containing aromatic heterocyclic compound (B) is at least one selected from the group consisting of a compound represented by General Formula (II), a compound represented by General Formula (III), and a compound represented by General Formula (V),

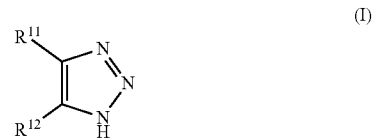

(I)

in General Formula (I), $R^{11}$ and $R^{12}$ each independently represent a hydrogen atom, or a substituted or unsubstituted hydrocarbon group, and $R^{11}$ and $R^{12}$ may be bonded to each other to form a ring

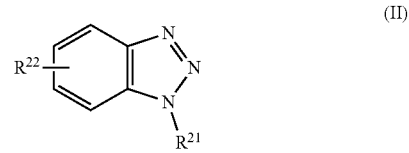

(II)

in General Formula (II), $R^{21}$ represents an aryl group and $R^{22}$ represents a hydrogen atom, a hydroxyl group, or a substituted or unsubstituted hydrocarbon group,

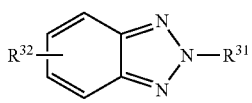
(III)

in General Formula (III), $R^{31}$ represents an aryl group and $R^{32}$ represents a hydrogen atom, or a substituted or unsubstituted hydrocarbon group,

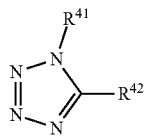
(IV)

in General Formula (IV), $R^{41}$ represents a hydrogen atom, and $R^{42}$ represents a hydrogen atom, a hydroxyl group, a mercapto group, or an amino group,

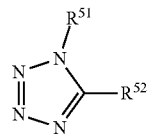
(V)

in General Formula (V), $R^{51}$ and $R^{52}$ each independently represent a hydrogen atom, or a substituted or unsubstituted aryl group, provided that at least one of $R^{51}$ or $R^{52}$ represents a substituted or unsubstituted aryl group.

55. The treatment liquid according to claim 54,
wherein a content of the nitrogen-containing aromatic heterocyclic compound (B) is 0.01 to 10,000 ppm by mass with respect to a total mass of the treatment liquid.

56. The treatment liquid according to claim 54,
wherein a content of the nitrogen-containing aromatic heterocyclic compound (B) is 0.5 to 80 ppm by mass with respect to a total mass of the treatment liquid.

57. The treatment liquid according to claim 54, further comprising one or more fluorine-containing compounds selected from the group consisting of hydrofluoric acid, ammonium fluoride, tetramethylammonium fluoride, and tetrabutylammonium fluoride.

58. The treatment liquid according to claim 54, further comprising a basic compound.

59. The treatment liquid according to claim 54,
wherein the treatment liquid is used as a washing liquid for removing etching residues, a solution for removing a resist film used for pattern formation, a washing liquid for removing residues from a substrate after chemical mechanical polishing, or an etching liquid.

* * * * *